(12) United States Patent
Furukawa et al.

(10) Patent No.: US 7,989,222 B2
(45) Date of Patent: *Aug. 2, 2011

(54) METHOD OF MAKING INTEGRATED CIRCUIT CHIP UTILIZING ORIENTED CARBON NANOTUBE CONDUCTIVE LAYERS

(75) Inventors: Toshiharu Furukawa, Essex Junction, VT (US); Mark Charles Hakey, Fairfax, VT (US); Steven John Holmes, Guilderland, NY (US); David Vaclav Horak, Essex Junction, VT (US); Charles William Koburger, III, Delmar, NY (US); Peter H. Mitchell, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/830,510

(22) Filed: Jul. 6, 2010

(65) Prior Publication Data

US 2010/0273298 A1    Oct. 28, 2010

Related U.S. Application Data

(60) Division of application No. 11/924,894, filed on Oct. 26, 2007, now Pat. No. 7,786,583, which is a division of application No. 11/552,771, filed on Oct. 25, 2006, now Pat. No. 7,439,081, which is a continuation of application No. 10/901,858, filed on Jul. 29, 2004, now Pat. No. 7,129,097.

(51) Int. Cl.
*H01L 21/00* (2006.01)

(52) U.S. Cl. .............. 438/1; 438/105; 438/122; 257/40; 257/E23.145; 257/E51.04; 977/742; 977/842

(58) Field of Classification Search .............. 438/1, 105, 438/122; 257/40, E23.145, E51.04; 977/742, 977/842
See application file for complete search history.

(56) References Cited

U.S. PATENT DOCUMENTS 7,011,771 B2    3/2006    Gao et al.
(Continued)

FOREIGN PATENT DOCUMENTS

GB    2382718 A    6/2002

OTHER PUBLICATIONS

S. Huang et al., "Oriented Long Single Walled Carbon Nanotubes on Substrates from Floating Catalysts", Letters, Journal of Physical Chemistry, vol. 107, No. 48 (Dec. 4, 2003).

(Continued)

*Primary Examiner* — Andy Huynh
(74) *Attorney, Agent, or Firm* — Roy W. Truelson

(57) ABSTRACT

A conductive layer in an integrated circuit is formed as a sandwich having multiple sublayers, including at least two sublayers of oriented carbon nanotubes. A first sublayer is created by growing carbon nanotubes in a first direction parallel to the chip substrate from a catalyst in the presence of a reactant gas flow in the first direction, and a second sublayer is created by growing carbon nanotubes in a second direction parallel to the substrate and different from the first direction from a catalyst in the presence of a reactant gas flow in the second direction. The first and second directions are preferably substantially perpendicular. The conductive layer sandwich preferably contains one or more additional sublayers of a conductive material, such as a metal.

10 Claims, 16 Drawing Sheets

U.S. PATENT DOCUMENTS

| | | | |
|---|---|---|---|
| 7,129,097 B2 * | 10/2006 | Furukawa et al. | 438/1 |
| 7,161,286 B2 | 1/2007 | Liu et al. | |
| 7,166,325 B2 | 1/2007 | Dai et al. | |
| 7,282,191 B1 | 10/2007 | Choi et al. | |
| 7,439,081 B2 * | 10/2008 | Furukawa et al. | 438/1 |
| 2002/0025374 A1 | 2/2002 | Lee et al. | |
| 2002/0153160 A1 | 10/2002 | Hofmann et al. | |
| 2002/0163079 A1 | 11/2002 | Awano | |
| 2003/0143398 A1 | 7/2003 | Ohki et al. | |
| 2003/0165418 A1 | 9/2003 | Ajayan et al. | |
| 2003/0178617 A1 | 9/2003 | Appenzeller et al. | |
| 2004/0005258 A1 | 1/2004 | Fonash et al. | |
| 2004/0152240 A1 | 8/2004 | Dangelo | |

OTHER PUBLICATIONS

S. Huang et al., "Growth of Millimeter-Long and Horizontally Aligned Single-Walled Carbon Nanotubes on Flat Substrates", Journal of the Chemical Society, vol. 125, No. 19 (Apr. 22, 2003).

J. Li et al., "Bottom-up approach for carbon nanotube interconnects", Applied Physics Letters, vol. 82, No. 15 (Apr. 14, 2003) Abstract Only.

W. Li et al., "Clean double-walled carbon nanotubes synthesized by CVD", Chemical Physics Letters 368, 299-06 (2003).

L Kalaugher, "Infineon forges ahead with nanotube applications" (Published on the World Wide Web at nanotechweb.org, Dec. 2002).

B. Zheng et al., "Efficient CVD Growth of Single-Walled Carbon Nanotubes on surfaces Using Carbon Monoxide Precursor", Nano Letters, American Chemist Society (Manuscript dated Jun. 26, 2002).

Z. Huang et al., "Effect of nickel, iron and cobalt on growth of aligned carbon nanotubes", Applied Physics A 74, 387-391 (Mar. 4, 2002).

W. Li et al., "Effect of temperature on growth and structure of carbon nanotubes by chemical vapor deposition", Applied Physics A 74, 397-402 (Mar. 4, 2002).

W. Li et al., "Effect of gas pressure on the growth and structure of carbon nanotubes by chemical vapor deposition", Applied Physics A 73, 259-264 (Jun. 20, 2001).

Y. Li et al., "Preparation of Monodispersed Fe-Mo Nanoparticles as the Catalyst for CVD Synthesis of Carbon Nanotubes", Chem. Mater. vol. 13, No. 3 (American Chemical Society, Feb. 6, 2001).

D. Li et al., "Structure and growth of aligned carbon nanotube films by pyrolysis", Chemical Physics Letters 316, 349-355 (Jan. 21, 2000).

Z. F. Ren et al., "Large arrays of Well-Aligned Carbon Nanotubes", Proceedings of the 13th Int'l Winter School on Electronic Properties of Novel Materials, pp. 263-267 (Feb. 27-Mar. 6, 1999).

* cited by examiner

METHOD OF MAKING INTEGRATED CIRCUIT CHIP UTILIZING ORIENTED CARBON NANOTUBE CONDUCTIVE LAYERS

CROSS REFERENCE TO RELATED APPLICATIONS

This is a divisional application of U.S. patent application Ser. No. 11/924,894, filed Oct. 26, 2007, entitled "INTEGRATED CIRCUIT CHIP UTILIZING ORIENTED CARBON NANOTUBE CONDUCTIVE LAYERS", which is a divisional application of U.S. patent application Ser. No. 11/552,771, filed Oct. 25, 2006, entitled "INTEGRATED CIRCUIT CHIP UTILIZING ORIENTED CARBON NANOTUBE CONDUCTIVE LAYERS", now issued as U.S. Pat. No. 7,439,081 B2, which is a continuation of U.S. patent application Ser. No. 10/901,858, filed Jul. 29, 2004, entitled "INTEGRATED CIRCUIT CHIP UTILIZING ORIENTED CARBON NANOTUBE CONDUCTIVE LAYERS", now issued as U.S. Pat. No. 7,129,097 B2, all of which are herein incorporated by reference. This application claims priority under 35 U.S.C. §120 of U.S. patent application Ser. No. 11/924,894, filed Oct. 26, 2007, of U.S. patent application Ser. No. 11/552,771, filed Oct. 25, 2006 and U.S. patent application Ser. No. 10/901,858, filed Jul. 29, 2004.

The present application is also related to application Ser. No. 10/787,640, by Toshiharu Furukawa, et al., entitled "INTEGRATED CIRCUIT CHIP UTILIZING CARBON NANOTUBE COMPOSITE INTERCONNECTION VIAS", filed Feb. 26, 2004, now issued as U.S. Pat. No. 7,135,773 B2, which is herein incorporated by reference.

FIELD OF THE INVENTION

The present invention relates to digital data processing, and in particular to the design integrated circuit chips used as components of digital data systems.

BACKGROUND OF THE INVENTION

In the latter half of the twentieth century, there began a phenomenon known as the information revolution. While the information revolution is a historical development broader in scope than any one event or machine, no single device has come to represent the information revolution more than the digital electronic computer. The development of computer systems has surely been a revolution. Each year, computer systems become faster, store more data, and provide more applications to their users.

A modern computer system typically comprises a central processing unit (CPU) and supporting hardware necessary to store, retrieve and transfer information, such as communications buses and memory. It also includes hardware necessary to communicate with the outside world, such as input/output controllers or storage controllers, and devices attached thereto such as keyboards, monitors, tape drives, disk drives, communication lines coupled to a network, etc. The CPU is the heart of the system. It executes the instructions which comprise a computer program and directs the operation of the other system components.

From the standpoint of the computer's hardware, most systems operate in fundamentally the same manner. Processors are capable of performing a limited set of very simple operations, such as arithmetic, logical comparisons, and movement of data from one location to another. But each operation is performed very quickly. Programs which direct a computer to perform massive numbers of these simple operations give the illusion that the computer is doing something sophisticated. What is perceived by the user as a new or improved capability of a computer system is made possible by performing essentially the same set of very simple operations, but doing it much faster. Therefore continuing improvements to computer systems require that these systems be made ever faster.

The overall speed of a computer system (also called the throughput) may be crudely measured as the number of operations performed per unit of time. There are numerous ways in which system speed might be improved, but conceptually the simplest and most fundamental of all improvements is to increase the speed at which the basic circuits operate, i.e., to increase the clock speeds of the various components, and particularly the clock speed of the processor(s). E.g., if everything runs twice as fast but otherwise works in exactly the same manner, the system will perform a given task in half the time.

Clock speeds are necessarily limited by various design parameters, and in particular are limited by signal propagation delays. In general, clock speeds can be increased if the length of signal paths is reduced, i.e., by shrinking the size of the logic elements. Early computer processors, which were constructed from many discrete components, were susceptible to significant speed improvements by shrinking component size, reducing discrete component numbers, and eventually, packaging the entire processor as an integrated circuit on a single chip. Modern processor chip designs often include one or more caches on the same integrated circuit chip as the processor, and in some cases include multiple processors on a single integrated circuit chip.

Despite the enormous improvement in speed obtained from integrated circuitry, the demand for ever faster computer systems has continued. With this demand comes a need for even further size reduction in the logic circuitry within an integrated circuit chip.

A typical integrated circuit chip is constructed in multiple layers. Many active and passive elements are formed on a substrate (usually silicon). A dielectric layer is placed over the elements, and multiple conductive layers, each separated by another dielectric layer, are formed over the elements. The conductive layers carry power and ground potentials, as well as numerous signal interconnects running among active elements. Each conductive layer comprises multiple discrete conductors, often running substantially in parallel. Conductive interconnects between conductive layers, or between a conductive layer and an active or passive element, are formed as holes in the dielectric layers, called vias, into which a conductive metal, such as aluminum or copper, is introduced.

The number of active elements in a typical processor dictates a very large number of interconnections, and since these must be packaged within a small area, the size of individual interconnections is limited. Conductors, whether in the conductive layer or the via between conductive layers, have a small, finite resistance, which grows as the cross-sectional area of the conductor shrinks. Increasing the number of logic elements on a chip requires a larger number of conductors, which in turn reduces the amount of space available for each individual conductor. If all other design parameters remain the same, this has the effect of increasing the resistances of the individual conductors. A need exists for improved design techniques for forming interconnection conductors, which will support reduced size of interconnects and greater circuit element density.

Recently, it has been suggested that carbon nanotubes might be used to form conductive pathways in integrated circuits. Carbon nanotubes are pure carbon molecular structures in which a graphite-like structural layer of covalently bonded carbon atoms is wrapped around into a cylindrical shape. Such a structure has a diameter in the nanometer range, and is potentially orders of magnitude longer in the axial dimension. Some carbon nanotubes have extremely high electrical conductivity up to a current limit. The conductivity of these carbon nanotubes is significantly higher (by some estimates, an order of magnitude higher) than that of ordinary metals. Additionally, the current capacity of carbon nanotubes is higher than metals, so that use of nanotubes as conductors can be expected to improve the long-term stability of the form and electrical resistance of the structure.

While the high conductivity of certain carbon nanotubes suggests possible application in electronic circuits, there are significant engineering hurdles involved in design and commercial production of a successful device using carbon nanotubes.

SUMMARY OF THE INVENTION

Conductive paths in an integrated circuit are formed using multiple layers of oriented carbon nanotubes. Specifically, multiple conductive paths are formed in a conductive layer between dielectric layers, the conductive layer being a sandwich having at least one sublayer of oriented carbon nanotubes and at least one sublayer of conductive material. The conductive layer preferably is constructed as a sandwich containing one or more sublayers of conductive material and at least two sublayers containing carbon nanotubes, in which the carbon nanotubes are oriented in a first direction in a first sublayer and in a second direction, substantially perpendicular to the first direction, in the second sublayer.

In one of several disclosed embodiments, a catalyst is first deposited in patterns on a chip surface, and an oriented sublayer of carbon nanotubes is grown on the surface from the catalyst in the presence of a directional flow of reactant gases.

In any of the various preferred embodiments, the conductive layer, comprising multiple layers of conductive material and oriented carbon nanotubes, is suitably patterned by etching to form multiple conductive paths after the sandwich of multiple sublayers is formed.

The use of a conductive layer "sandwich" having carbon nanotubes oriented in perpendicular horizontal directions provides a high-conductivity path in any arbitrary horizontal direction. The interspersed conductive material provides further electrical contact area at the boundaries of carbon nanotubes.

The details of the present invention, both as to its structure and operation, can best be understood in reference to the accompanying drawings, in which like reference numerals refer to like parts, and in which:

DETAILED DESCRIPTION OF THE PREFERRED EMBODIMENTS

Figure 1:
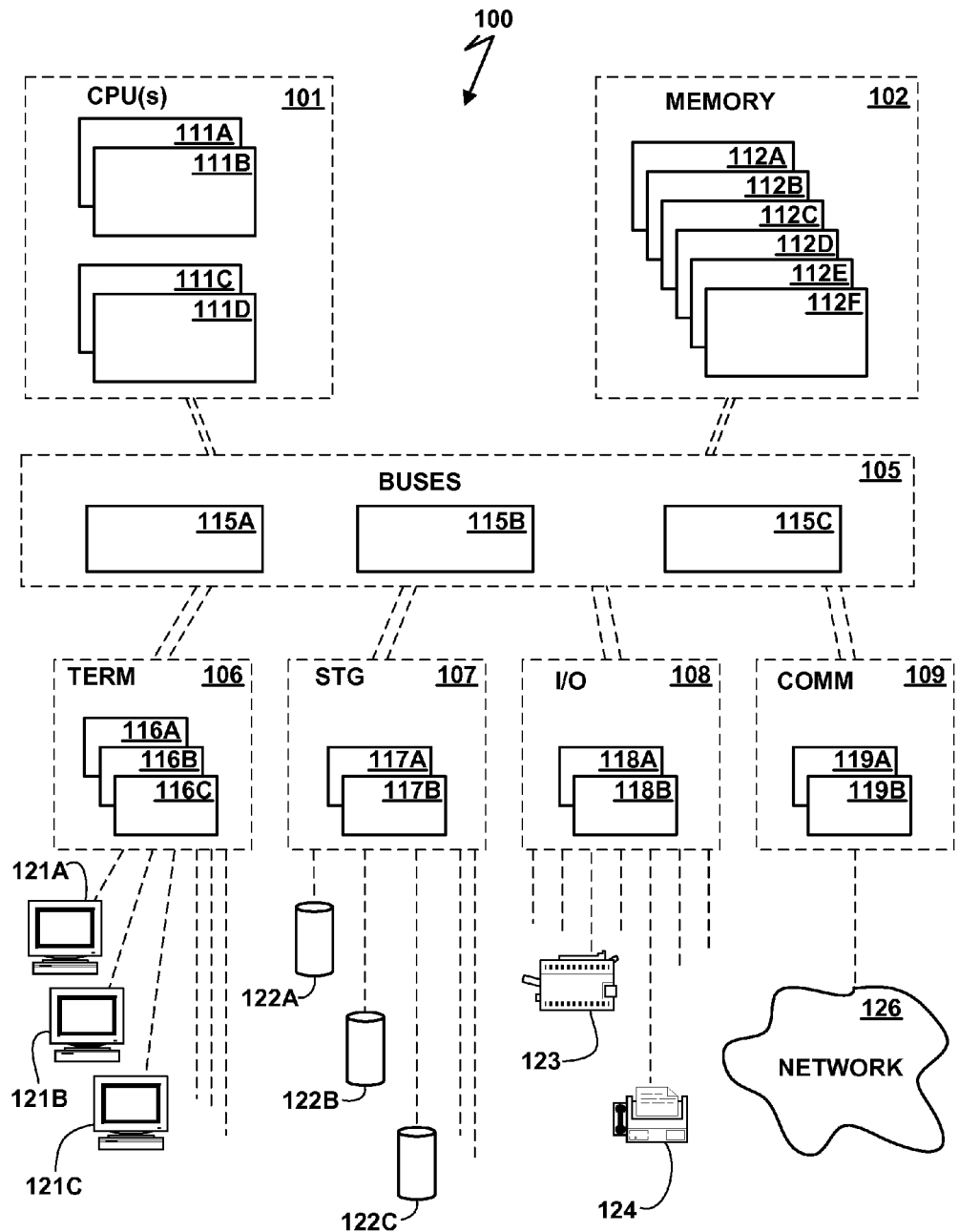
FIG. 1 is a high-level block diagram of the major hardware components of a computer system for utilizing integrated circuits having carbon nanotube conductors, according to the preferred embodiment of the present invention.

Referring to the Drawing, wherein like numbers denote like parts throughout the several views, FIG. 1 is a high-level representation of the major hardware components of a computer system 100 for utilizing integrated circuits having carbon nanotube conductors, according to the preferred embodiment of the present invention. At a functional level, the major components of system 100 are shown in FIG. 1 outlined in dashed lines; these components include one or more central processing units (CPU) 101, main memory 102, terminal interface 106, storage interface 107, I/O device interface 108, and communications/network interfaces 109, all of which are coupled for inter-component communication via one or more buses 105.

CPU 101 is one or more general-purpose programmable processors, executing instructions stored in memory 102; system 100 may contain either a single CPU or multiple CPUs, either alternative being collectively represented by feature CPU 101 in FIG. 1, and may include one or more levels of on-board cache (not shown). Memory 102 is a random-access semiconductor memory for storing data and programs. Memory 102 is conceptually a single monolithic entity, it being understood that memory is often arranged in a hierarchy of caches and other memory devices. Additionally, memory 102 may be divided into portions associated with particular CPUs or sets of CPUs and particular buses, as in any of various so-called non-uniform memory access (NUMA) computer system architectures.

Terminal interface 106 provides a connection for the attachment of one or more user terminals 121A-C (referred to generally as 121), and may be implemented in a variety of ways. Many large server computer systems (mainframes) support the direct attachment of multiple terminals through terminal interface I/O processors, usually on one or more electronic circuit cards. Alternatively, interface 106 may provide a connection to a local area network to which terminals 121 are attached. Various other alternatives are possible. Data storage interface 107 provides an interface to one or more data storage devices 122A-C, (referred to generally as 122), which are typically rotating magnetic hard disk drive units, although other types of data storage device could be used. I/O and other device interface 108 provides an interface to any of various other input/output devices or devices of other types.

Two such devices, printer 123 and fax machine 124, are shown in the exemplary embodiment of FIG. 1, it being understood that many other such devices may exist, which may be of differing types. Communications interface 109 provides one or more communications paths from system 100 to other digital devices and computer systems; such paths may include, e.g., one or more networks 126 such as the Internet, local area networks, or other networks, or may include remote device communication lines, wireless connections, and so forth.

Buses 105 provide communication paths among the various system components. Although a single conceptual bus entity 105 is represented in FIG. 1, it will be understood that a typical computer system may have multiple buses, often arranged in a complex topology, such as point-to-point links in hierarchical, star or web configurations, multiple hierarchical busses, parallel and redundant paths, etc., and that separate buses may exist for communicating certain information, such as addresses or status information.

Physically, the major functional units are typically embodied in one or more integrated circuit chips. Such chips are generally mounted on electronic circuit card assemblies, with multiple chips often mounted on a single circuit card. In FIG. 1, CPU 101 is represented as containing four integrated circuit chips 111A-D, each of which may contain one or more processors, or may perform only part of the functions of a single processor; memory 102 is represented as containing six chips 112A-112F, buses 105 as containing three chips 115A-C, terminal interface 106 as containing three chips 116A-116C, storage interface 107 as containing two chips 117A-B, I/O and other interface 108 as containing two chips 118A-B, and communications interface 109 as containing two chips 119A-B. However, the actual number of such chips may vary.

It should be understood that FIG. 1 is intended to depict the representative major components of an exemplary system 100 at a high level, that individual components may have greater complexity than represented FIG. 1, and that the number, type and configuration of such functional units and physical units may vary considerably. It will further be understood that not all components shown in FIG. 1 may be present in a particular computer system, and that other components in addition to those shown may be present. Although system 100 is depicted as a multiple user system having multiple terminals, system 100 could alternatively be a single-user system, typically containing only a single user display and keyboard input, or might be a server or similar device which has little or no direct user interface, but receives requests from other computer systems (clients).

Figure 2:
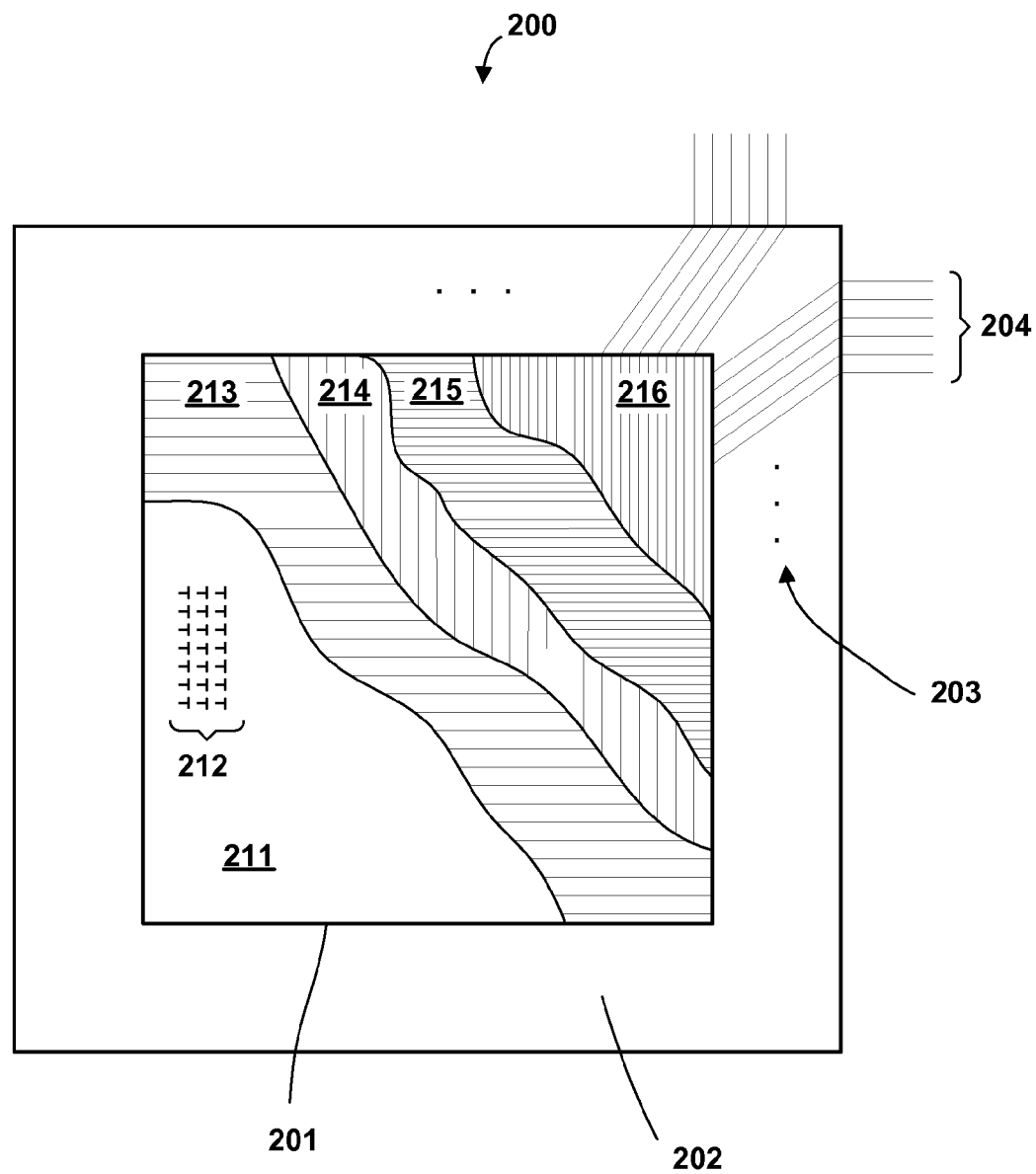
FIG. 2 is a simplified illustration of an integrated circuit module in cut-away, top view representation, according to the preferred embodiment.
Figure 3:
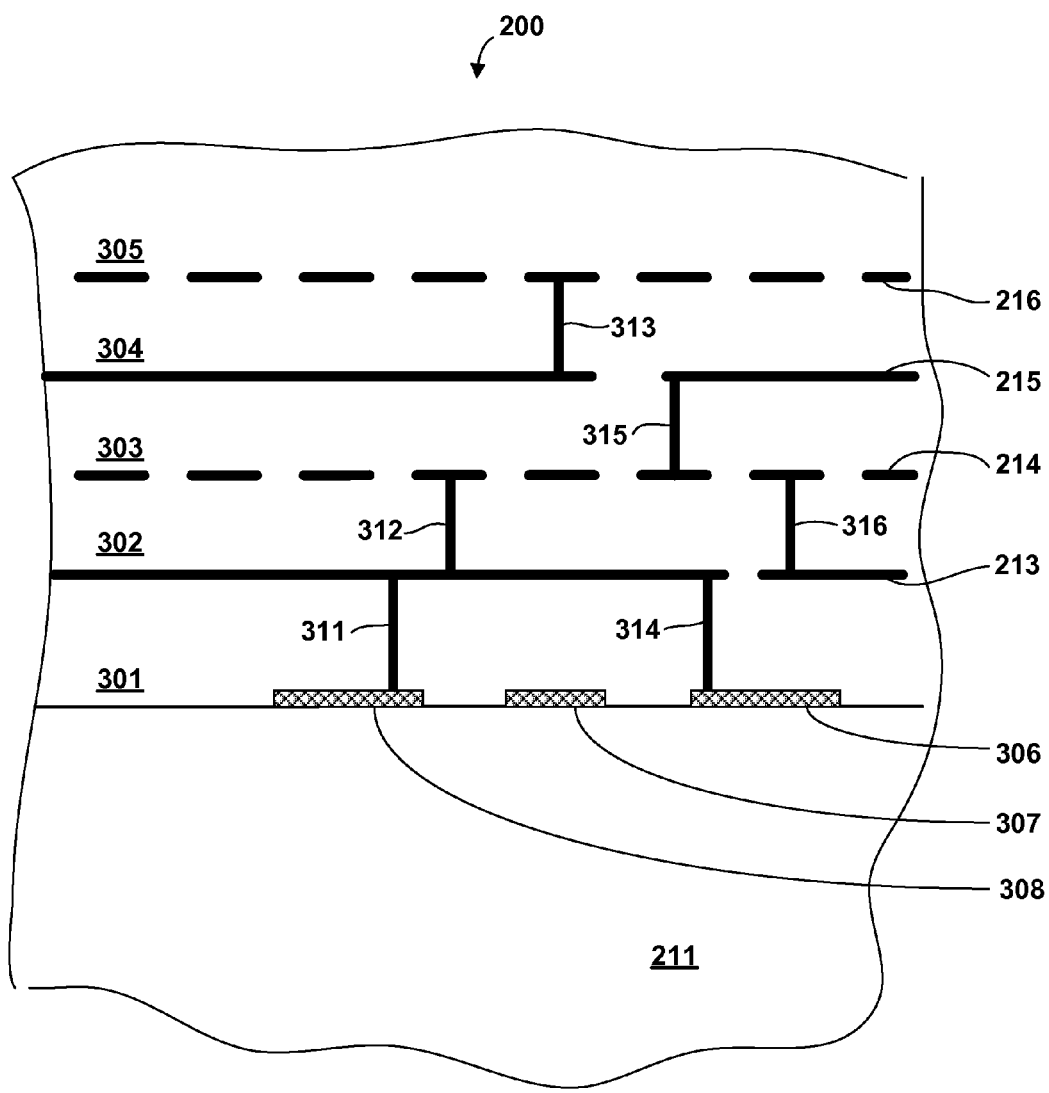
FIG. 3 is a simplified illustration of a portion of an integrated circuit module in cross-sectional view, according to the preferred embodiment.

FIG. 2 and FIG. 3 are simplified illustrations of an integrated circuit module 200, also called a "chip", according to the preferred embodiment. Integrated circuit module 200 is shown in FIG. 2 in a cut-away, top view representation. A portion of integrated circuit module 200 is shown in cross-section in FIG. 3 Integrated circuit module 200 represented in FIGS. 2 and 3 may be any of modules 111A-D, 112A-F, 115A-C, 116A-116C, 117A-B, 118A-B, or 119A-B, or could be some other module not represented in FIG. 1. Integrated circuit module 200 contains a chip 201, i.e. various electronic circuits and elements formed on a single relatively broad, flat semiconductor substrate. The substrate and electronics integrally formed thereon (chip) is surrounded by and encapsulated in a protective insulator 202. The entire assembly is typically mounted on an electronic circuit card (not shown) having multiple conductive paths for connecting the module to other components of a digital device. Such a card often has multiple integrated circuit modules mounted thereon. Multiple conductive lines 203 emanate from the substrate chip and connect to I/O pins 204 which extend from module 200. I/O pins 204 are coupled to the conductive paths in the electronic circuit card. Although the I/O pins are shown in FIG. 2 along the two edges of module 200 for illustrative purposes, they are often mounted along all four edges. Alternatively, I/O connections may be formed in various other ways, now known or hereafter developed; e.g., I/O connections can be formed in the bottom of the module, using pins, pads, or balls.

Chip 201 is a thin, flat member which is constructed in multiple layers. The bottom layer is a semiconductor substrate 211, which is typically silicon, although other materials, such as SiGe, SiC and GaAs, are possible. The semiconductor layer may optionally be deposited over one or more layers of a different material providing structural support or other function, such as sapphire. Multiple active and/or passive devices 212, such as field-effect transistors, are formed on the substrate by selective doping of the substrate, and deposition of additional insulator (dielectric) and conductive material. Logic circuits are created by connecting the various active and passive devices in a desired configuration, and providing power and ground connections to the active devices. Conductive interconnections between active devices are placed in multiple layers containing conductors 213-216, each layer being separated from adjacent layers by insulative layers 301-305.

Since the number of active devices and interconnections is typically very large, and the design of an integrated circuit typically requires interconnections in various directions, physical placement of interconnections is a challenging design issue. Generally, individual conductors within a conductive layer run in a single direction, the direction alternating at right angles with successive conductive layers. Conductive vias 311-316 penetrate the insulative layer or layers between conductive layers, to make electrical connections. A conductive via may run between two conductors in different conductive layers (as represented in FIG. 3 by vias 312, 313, 315 and 316), or between some part of an active or passive device 306-308 and a conductive layer (as represented in FIG. 3 by vias 311 and 314. A single conductive path may traverse several conductive layers and several vias.

It will be understood that FIGS. 2 and 3 are intended as a high-level representation of an integrated circuit module for illustrative purposes, and are not necessarily to scale. The actual number of active devices contained on a single chip module is so large and the size of an individual device so small as to be difficult or impossible to illustrate to scale in a single drawing. Furthermore, while four conductive layers are shown, the actual number of such layers may vary.

In order to support improved capabilities of computer systems and other digital devices, it is desirable to decrease the size of, and increase the number of, active and/or passive devices in an integrated circuit chip. Increasing the number of devices requires an increase in the number of conductive interconnections. Simply making all the conductors smaller and placing them closer together, without other design modifications, can result in increased resistance and capacitance of the conductors. Using conventional technology, it is difficult to achieve sufficient conductance of the interconnection conductors within the foreseeable space limitations of future integrated circuit designs.

In accordance with the preferred embodiment of the present invention, a conductive layer for multiple conductors in an integrated circuit chip is constructed as a sandwich of multiple sublayers, there being at least two sublayers of oriented carbon nanotubes, the carbon nanotubes in one oriented sublayer being substantially perpendicular to those in another, the carbon nanotubes in both layers being substantially parallel to the plane of the layer itself. The conductive layer preferably includes additional sublayers of unoriented, homogeneous conductive material, such as copper. The layer is preferably constructed as a single continuous layer, and subsequently patterned to form discrete electrical conductors in the layer. Because carbon nanotubes have an extremely high conductivity and current carrying capacity, they can carry the bulk of the electrical current within the conductors of the conductive layer. However, carbon nanotubes are long and narrow, and the conductivity of carbon nanotubes is directionally dependent. I.e., Carbon nanotubes conduct electricity in the direction of the tubes, and therefore the conductivity of a set of oriented carbon nanotubes is greatest in the direction of the orientation of the tubes, and less in directions orthogonal to the nanotube orientation. By arranging multiple sublayers of carbon nanotubes orthogonal to each other, high conductivity is achieved in any direction in the plane of the conductive layers. The additional sublayers of unoriented, homogeneous conductive material provide conductance at the interfaces between different carbon nanotubes or between a carbon nanotube and some other conductor.

Three alternative processes for forming a conductive layer having multiple differently oriented carbon nanotube sublayers in accordance with the preferred embodiment will now be described, with reference to FIGS. 4A-4G, 5, 6A-6E, 7, 8A-8H and 9. FIG. 5 is a flow diagram showing the overall process steps for forming a carbon nanotube conductive layer sandwich, according to a first preferred embodiment. FIGS. 4A-4G are simplified enlarged cross-sectional views of a portion of an integrated circuit chip, showing the construction of a carbon nanotube conductive layer sandwich at various stages, in accordance with the first preferred embodiment. FIG. 7 is a flow diagram showing the overall process steps for forming a carbon nanotube conductive layer sandwich, according to an alternative, or second preferred embodiment. FIGS. 6A-6E are simplified enlarged cross-sectional views of a portion of an integrated circuit chip, showing the construction of a carbon nanotube conductive layer sandwich at various stages, in accordance with the second preferred embodiment. FIG. 9 is a flow diagram showing the overall process steps for forming a carbon nanotube conductive layer sandwich, according to another alternative, or third preferred embodiment. FIGS. 8A-8H are simplified enlarged cross-sectional views of a portion of an integrated circuit chip, showing the construction of a carbon nanotube conductive layer sandwich at various stages, in accordance with the third preferred embodiment. It should be understood that FIGS. 4A-4G, FIGS. 6A-6E, and FIGS. 8A-8H are not necessarily drawn to scale, and in particular, the size and number of certain features such as carbon nanotubes and catalyst particles have been altered for illustrative purposes. While the processes below are illustrated and described with respect to a single layer for clarity, it will be understood that in a typical implementation, multiple layers are successively built in a single integrated circuit chip.

As is known, integrated circuit chips are typically built up in layers from a wafer substrate, successive layers being deposited according to any of various processes, sometimes selectively removed to create features, and eventually covered by other layers In a first preferred embodiment, a conductive layer is created by forming elongated parallel ridges (herein called "mandrels") of a seed material, and growing carbon nanotubes from one vertical side of the ridges to form a sublayer. A second carbon nanotube sublayer is similarly formed, placing the mandrels perpendicular to those of the first sublayer.

Figure 4A:
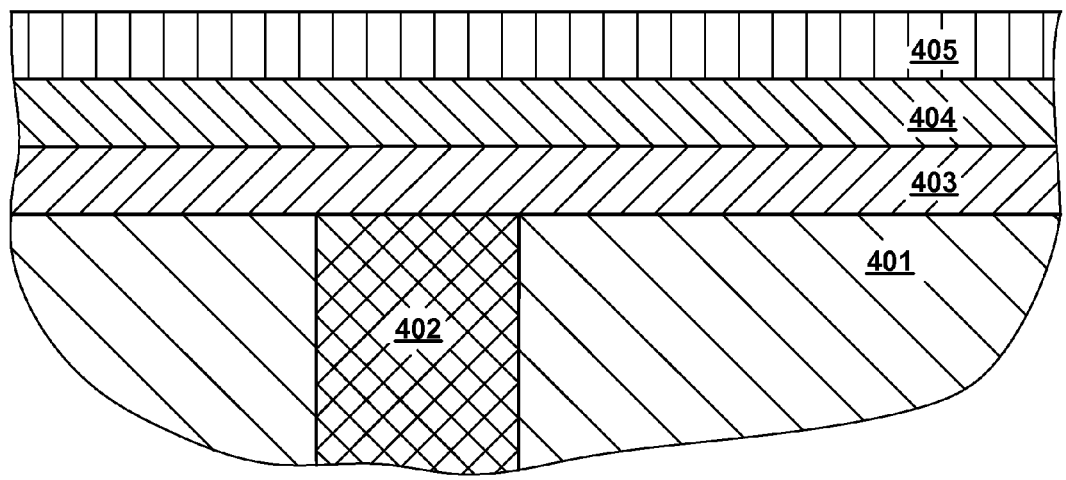
FIGS. 4A-4G are simplified enlarged cross-sectional views of a portion of an integrated circuit chip, showing the construction of a carbon nanotube conductive layer sandwich at various stages, in accordance with a first preferred embodiment.
Figure 5:
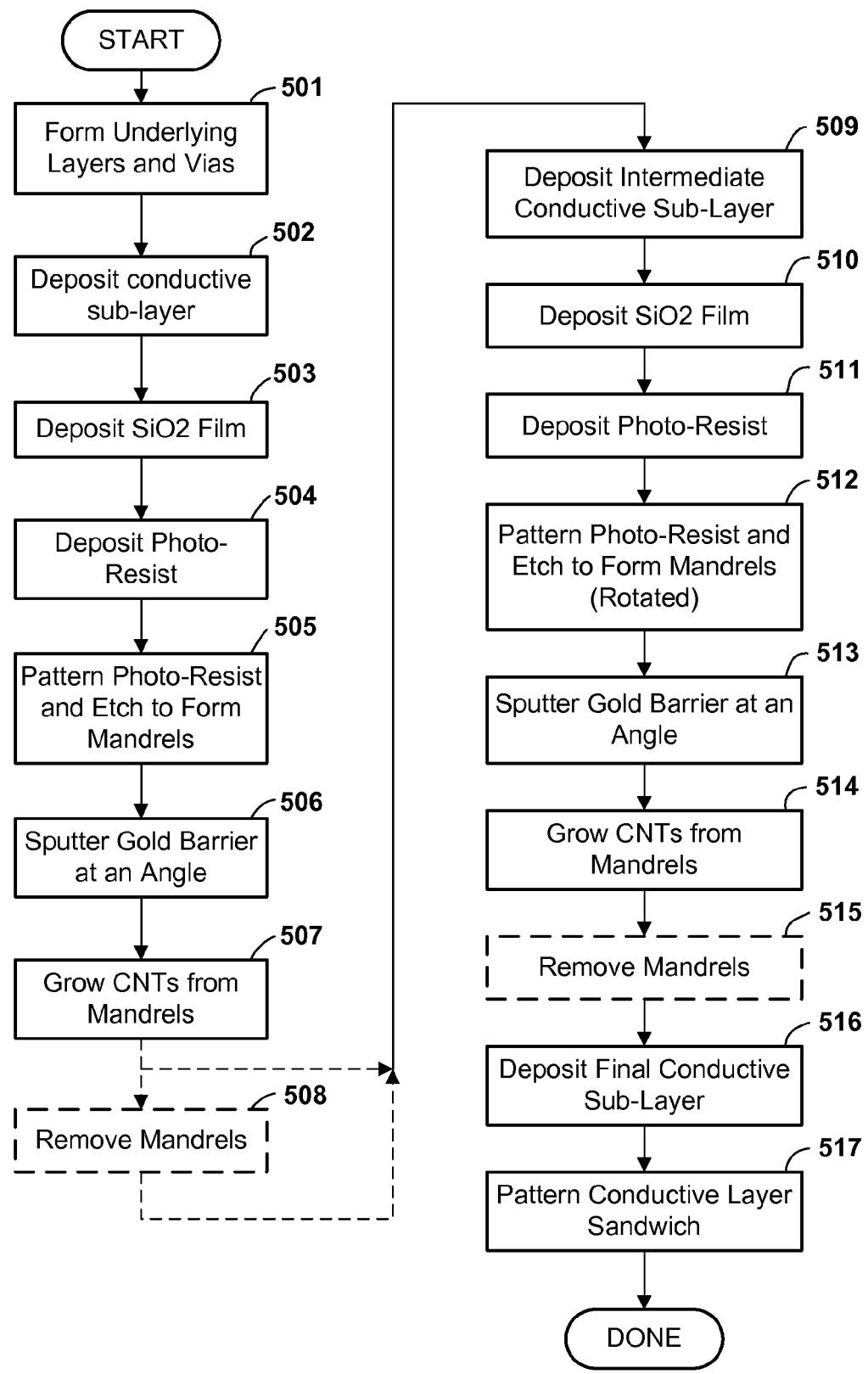
FIG. 5 is a flow diagram showing the overall process steps for forming a carbon nanotube conductive layer sandwich, according to the first preferred embodiment.

The process of creating a conductive layer having oriented carbon nanotubes according to the first preferred embodiment begins from a dielectric layer 401, illustrated in FIG. 4A. Dielectric layer 401 is fabricated on top of another layer (not shown), which could be another conductive layer, or could be the layer of active and passive devices formed on or in the substrate. Dielectric layer 401 is formed by depositing a substantially uniform dielectric layer on the lower layer, represented in FIG. 5 as step 501. Preferably, the dielectric layer is a fluorosilicate glass low-k dielectric, although other materials might alternatively be used. Dielectric layer 401 may be fabricated using any conventional technique, or any technique hereafter developed.

A plurality of conductive vias, of which one 402 is illustrated in FIG. 4A, form electrical connections between conductors in a layer or layers beneath dielectric layer 401, and layers above it. In the preferred embodiment, via 402 is a composite of carbon nanotubes and a conductive metal, constructed as described in U.S. patent application Ser. No. 10/787,640, by Toshiharu Furukawa, et al., entitled "Integrated Circuit Chip Utilizing Carbon Nanotube Composite Interconnection Vias", filed Feb. 26, 2004, which is herein incorporated by reference. However, via 402 could alternatively be constructed according to any conventional technique, or any technique hereafter developed.

With the underlying dielectric layer 401 and vias 402 in place, a thin sublayer of a homogenous, unstructured conductive material 403, such as a conductive metal, is deposited over the dielectric and vias (step 502). The thickness of sublayer 403 is preferably 5-20 nm, and even more specifically preferred to by 5-10 nm.

The preferred material for sublayer 403 is tungsten. However, for sublayer 403 as well as any of various other sublayers described herein requiring a homogeneous, unstructured conductive material, any of various materials are also possible, specifically tantalum, molybdenum, titanium, titanium nitride (TiN), tantalum nitride (TaN), tungsten silicide ($WSi_2$), doped polysilicon and/or doped amorphous silicon, as any of these materials can be readily etched using reactive ion etching, and have suitable conductivity values. Copper or gold are also possible materials, but they have a tendency to leach into typical dielectrics, and to interfere with the action of the carbon nanotube catalysts. For these reasons, copper or gold should not be used in sublayer 403 or certain other sublayers without a liner which acts as a barrier to migration. It may be possible to use copper or gold in some sub-layers without a liner, depending on the composition and function of neighboring structures. The possible conductive materials are not necessarily limited to the example materials listed herein.

A film of silicon oxide ($SiO_2$) 404 is deposited over sublayer 403 (step 503). The $SiO_2$ film layer 404 preferably has a thickness of 50-100 nm. A photoresist 405 is the deposited over $SiO_2$ film layer 404 (step 504). The three layers 403-405 may be deposited using any conventional process, such as by atomic layer deposition and/or chemical vapor deposition (CVD) or physical vapor deposition (PVD) or spin application processes, or by any process hereafter developed. FIG. 4A shows a resulting portion of a chip surface in cross section, after performing step 504, it being understood that in fact dielectric layer 401 contains multiple vias 402, and that additional layers (not shown) are formed below dielectric layer 401.

Figure 4B:
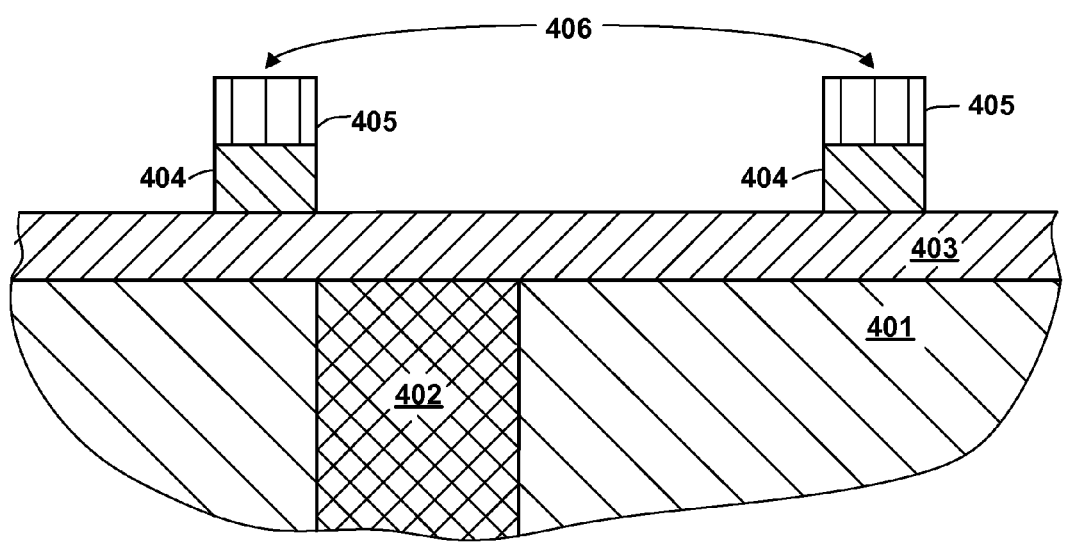

The photoresist layer 405 is then patterned lithographically, and the $SiO_2$ layer 404 is etched, using the resist as a mask (step 505). The residual resist is then removed. The pattern thus created in the SiO$_2$ layer is one of long, narrow parallel ridges 406 of SiO$_2$, which preferably extend the full length of the chip in one horizontal direction. These ridges are referred to herein as "mandrels" because they are used as a base for growing carbon nanotubes. The mandrels 406 are preferably 50-100 nm wide. The separation between adjacent mandrels is preferably 50-500 µm, and more specifically preferred to be approximately 100 µm. FIG. 4B shows a resulting portion of the chip surface in cross section, after performing step 505, this being the same chip portion as that depicted in FIG. 4A.

Figure 4C:
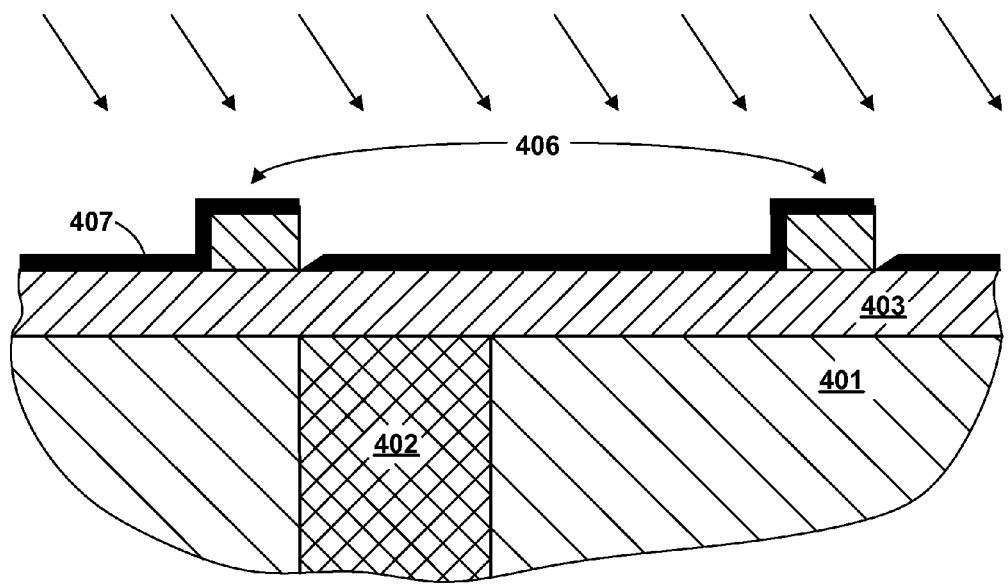

A thin barrier of gold 407 is then sputtered onto the chip surface from an angled orientation (step 506), as represented by the arrows in FIG. 4C. I.e., the direction of sputtering is substantially perpendicular to the longitudinal axis of the mandrels 406 (parallel to the plane of the cross-section of FIG. 4C), and forms an acute angle with the top surface of the chip. The effect of sputtering an at angled orientation is to coat the top surface and one of the vertical sides of the mandrels 406 (as well as the exposed top surface of conductive sublayer 403). The lee side of each mandrel, i.e., the vertical side opposite the direction from which the gold is sputtered, is not coated. The thickness of gold is preferably $1.1 \times 10^{17}$ atoms/cm$^2$ or greater, or approximately 20 nm or greater. Copper might alternatively be used as barrier 407. FIG. 4C shows the resulting portion of the chip surface in cross section after performing step 506.

Figure 4D:
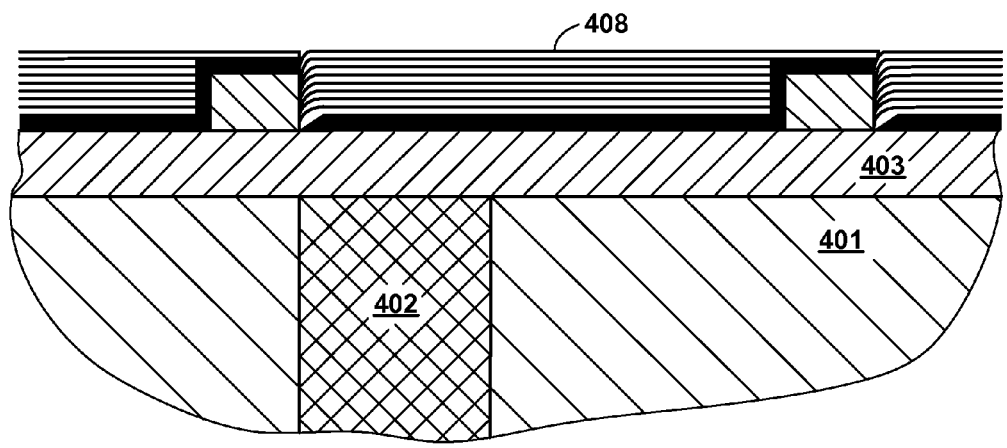

Oriented carbon nanotubes 408 are then grown from the lee sides of the mandrels, which were not coated with gold (step 507), to form a sublayer of horizontally oriented carbon nanotubes. In order to grow oriented carbon nanotubes, the wafer containing the chip is placed in a chemical vapor deposition chamber at 800° C. in the presence of a ferrocene catalyst dissolved in xylene hydrocarbon material, and allowed to react for 5-200 minutes. The gold inhibits growth of carbon nanotubes on any of the gold-coated surfaces. The only uncoated surfaces being the vertical walls of the mandrels, carbon nanotubes are grown from these vertical surfaces. The carbon nanotubes thus grown are generally multi-walled nanotubes, approximately 20-50 nm in diameter. If desired, the diameter of the carbon nanotubes can be varied outside this range (e.g., from 15-200 nm) by varying the temperature, gas pressure and catalyst size, i.e., carbon nanotube diameter increases with increasing temperature, pressure or catalyst size. These nanotubes tend to grow perpendicular to the base surface. Since the base surfaces are the uncoated vertical surfaces of the mandrels, all of which face the same direction, the resulting carbon nanotubes are grown in a parallel, oriented pattern. FIG. 4D represents the resulting portion of the chip surface in cross section after growing the carbon nanotubes in step 507.

Optionally, the silicon oxide mandrels 406 can then be selectively removed. The gold barrier 407 can be removed using a brief sputter reactive ion etch, followed by removal of the silicon oxide mandrels 406 using a wet etch or reactive ion etch (step 508). Since the mandrel material is non-conductive, removal of the mandrels, allowing the space to be filled with a conductive material, may cause a slight improvement in conductivity of the resulting structure. However, given the small size of the mandrels, this improvement may not be sufficient to justify the cost of the extra process steps.

Whether the mandrels are removed or not, a second sublayer 409 of a homogeneous conductive material is then deposited over the carbon nanotubes, filling any gaps between tubes, including any gaps left by removal of the mandrels, if such a removal is performed (step 509). Preferably, the second sublayer 409 is copper, and has a thickness of approximately 5-20 nm. However, any of the materials used for sublayer 403 could alternatively be used. If copper (or gold) is used, it may be desirable to deposit a liner 410 of TiN or TaN, 5-10 nm thick, before proceeding. The reason for liner 410 is that, in the absence of such a liner, it is possible that during the etch of the second set of silicon oxide mandrels (described as step 512 below), the reactive ion etch will sputter some of the copper material onto the sidewalls of the silicon oxide mandrels, causing poisoning of the catalyst necessary for growth of a second sublayer of carbon nanotubes. Whether liner 410 is actually necessary will depend on process conditions used for formation of the second set of mandrels and growth of carbon nanotubes therefrom. Where process conditions are sufficiently controlled to allow satisfactory carbon nanotube growth in the absence of liner 410, or where the material for sublayer 409 is other than copper or gold, liner 410 may be omitted.

Figure 4E:
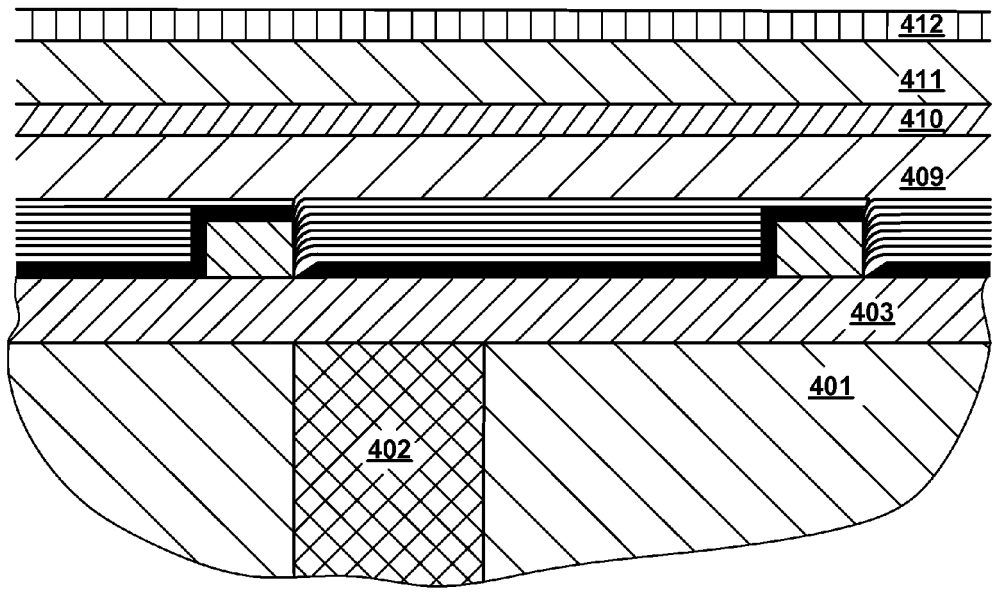
Figure 4F:
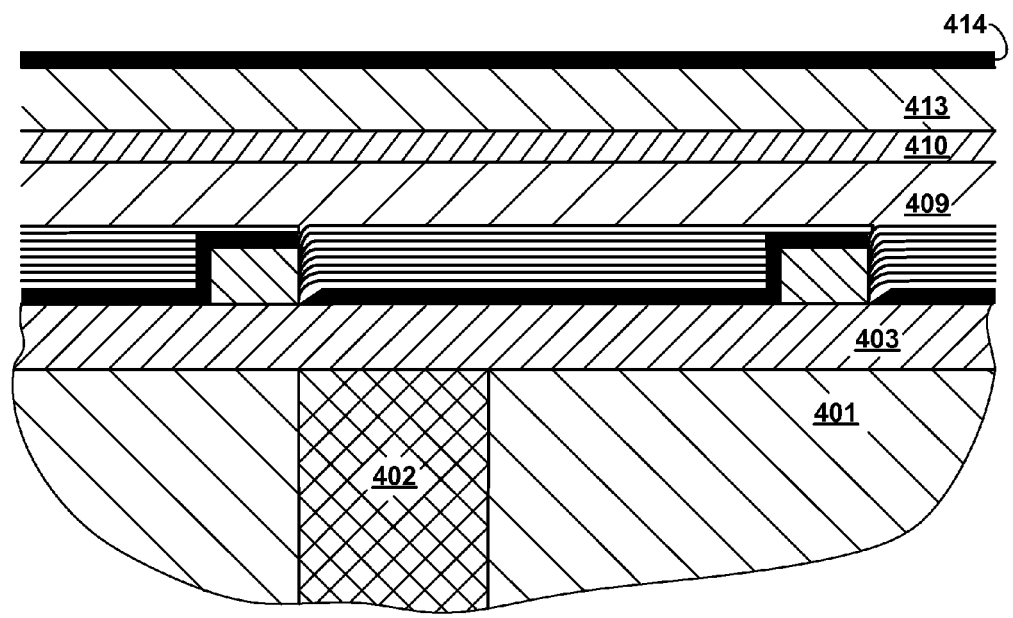
Figure 4G:
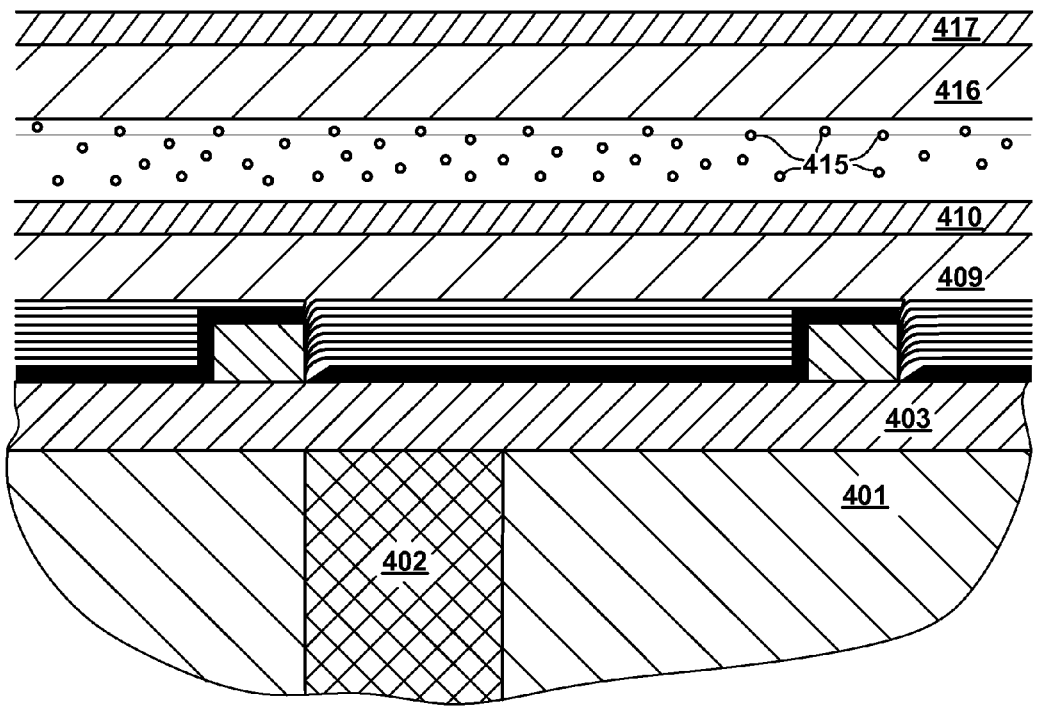

The processes described above with respect to steps 503-508 are then repeated, with the mandrels oriented perpendicular to the previous orientation. I.e., a film of silicon oxide 411 is deposited over sublayer 409 and liner 410 (step 510), as described above with respect to step 503. A photoresist 412 is deposited over the silicon dioxide (step 511), as described above with respect to step 504. FIG. 4E shows a resulting portion of a chip surface in cross section, after performing step 511. FIG. 4E, and subsequent FIGS. 4F and 4G, represent the chip surface in cross section at various process stages, assuming that optional step 508 is not performed; if optional step 508 is performed, the space occupied by mandrels 406 will be filled by conductive sublayer 409.

The photoresist 412 is then patterned, and the SiO$_2$ layer 404 is etched (step 512), as described above with respect to step 505. In the case of step 512, the pattern of the SiO$_2$ layer is one of long, narrow parallel ridges (mandrels) 413 identical in structure and dimensions to ridges 406, but which oriented horizontally and perpendicular to ridges 406. A thin barrier of gold 414 is then sputtered at an angle (step 513), as described above with respect to step 506. The direction of sputtering is substantially perpendicular to the longitudinal axis of the mandrels 413, and forms an acute angle with the top surface of the chip. The sputtering coats the top surface and one of the vertical sides of the mandrels 413 formed by step 512, leaving an uncoated vertical side as a base for growing carbon nanotubes horizontally. FIG. 4F shows a resulting portion of a chip surface in cross section, after performing step 513, in which a single mandrel 413 is shown, oriented parallel to and set back from the plane of the cross section.

Oriented carbon nanotubes 415 are then grown from the lee sides of mandrels 413 (step 514), as described above with respect to step 507. The carbon nanotubes thus grown are horizontal and perpendicular to the carbon nanotubes 408 grown in step 507. FIG. 4G depicts resulting nanotubes 415, which are oriented perpendicular to the plane of the cross section of FIG. 4G, and thus appear as small circles.

Optionally, mandrels 413 are then selectively removed using a wet etch or reactive ion etch (step 515), as described above with respect to step 508.

A third sublayer 416 of a homogeneous conductive material is then deposited over the sublayer of carbon nanotubes 415 (step 516). Sublayer 416 is preferably copper, although any of the materials described above for sublayer 403 might alternatively be used. Sublayer 416 should be sufficiently thick to fill any voids left by removal of mandrels 413 (is such optional removal is performed) and to fill any surface irregularities in the top surface of the sublayer 415 of carbon nanotubes, providing a relatively smooth and flat surface for deposit of the next layer. Preferably, sublayer 416 is approximately 20-50 nm thick. If necessary, the top surface of sublayer 416 can be subjected to chemical-mechanical polishing to produce an acceptably smooth surface. Where sublayer 416 is copper, a liner 417 of TiN or TaN is deposited over the copper to prevent copper migration into a subsequent dielectric layer. FIG. 4G shows the chip portion in cross section after performing step 516.

A continuous conductive layer comprising multiple sublayers is completely formed after step 516. The conductive layer sandwich is then patterned into multiple discrete conductors (or, in some cases, as a ground or power plane) using conventional patterning techniques (step 517). Further construction of the integrated circuit chip may then continue by forming another dielectric layer, vias at appropriate locations, and another conductive layer. Preferably, all conductive layers are formed using a process described herein, although it would alternatively be possible to form only some conductive layers using such a process.

Figure 6A:
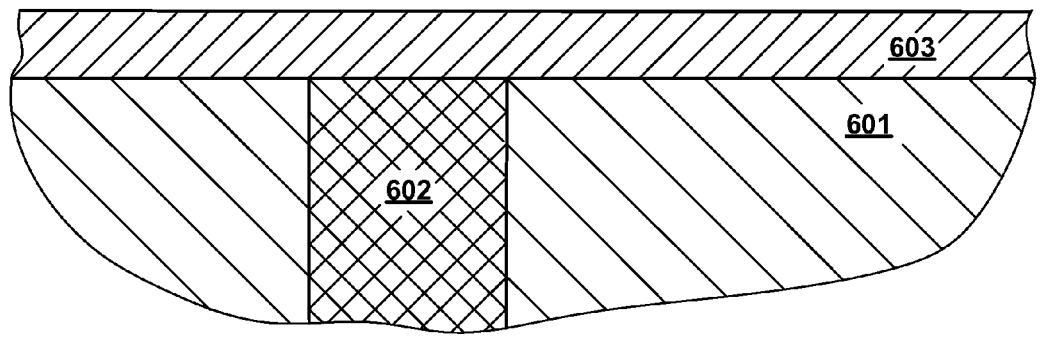
FIGS. 6A-6E are simplified enlarged cross-sectional views of a portion of an integrated circuit chip, showing the construction of a carbon nanotube conductive layer sandwich, in accordance with a second preferred embodiment.
Figure 6B:
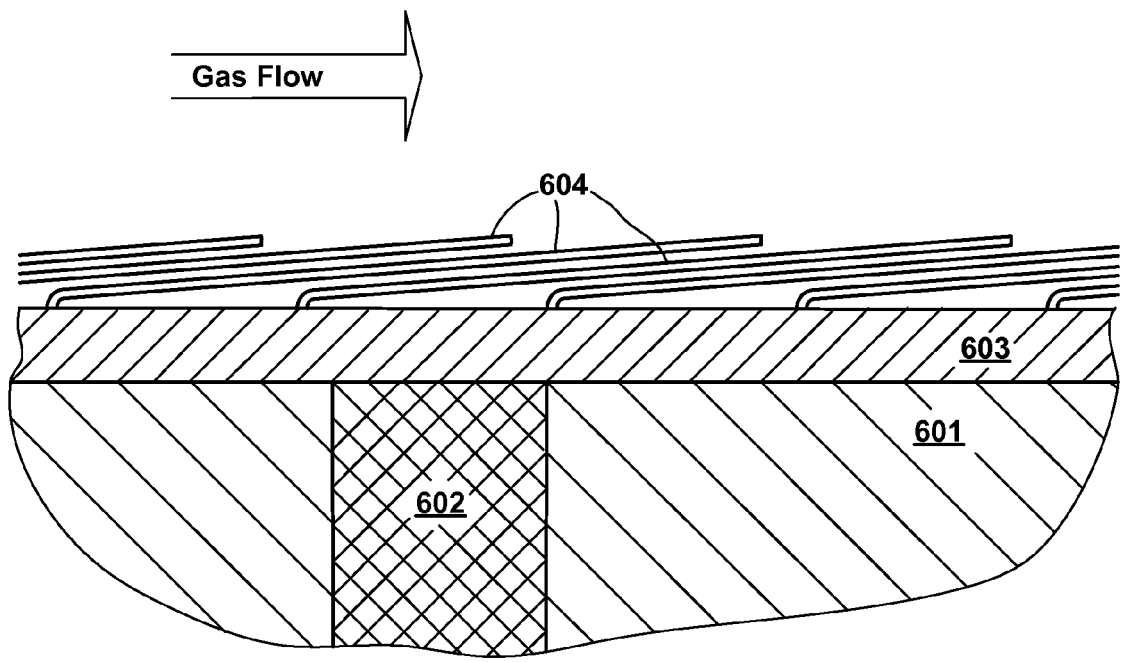
Figure 6C:
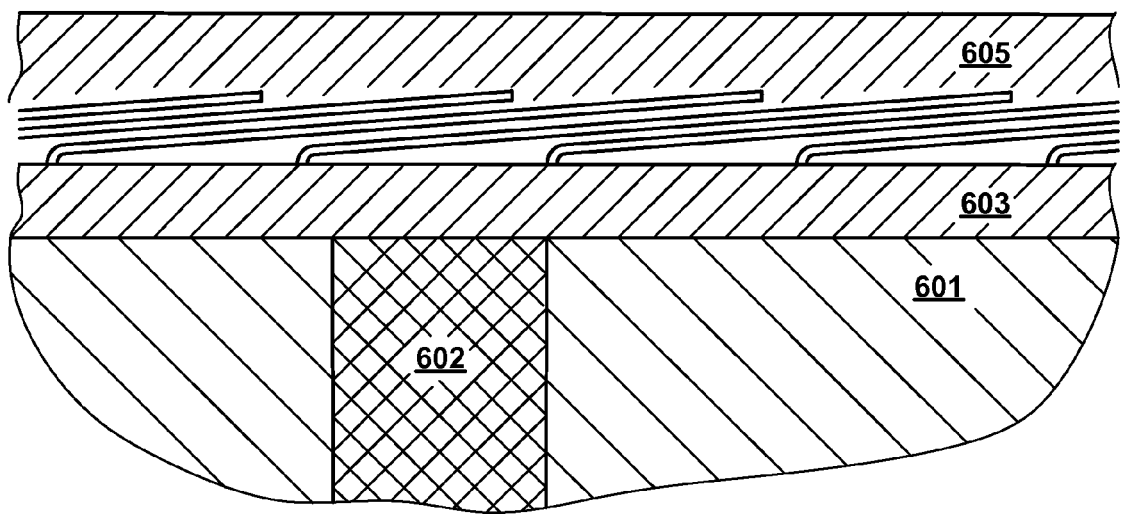
Figure 6D:
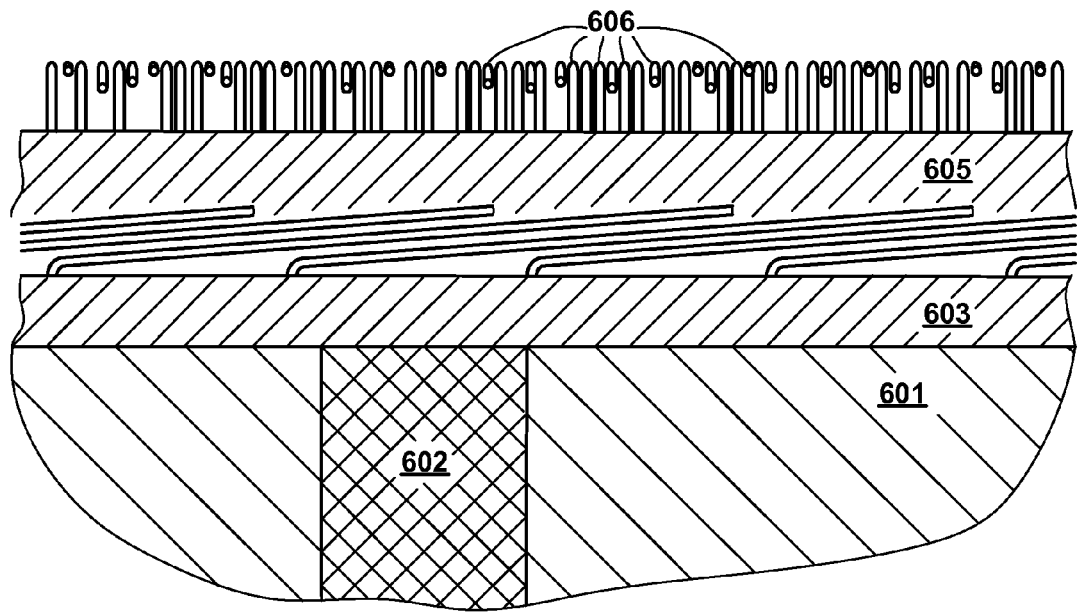
Figure 6E:
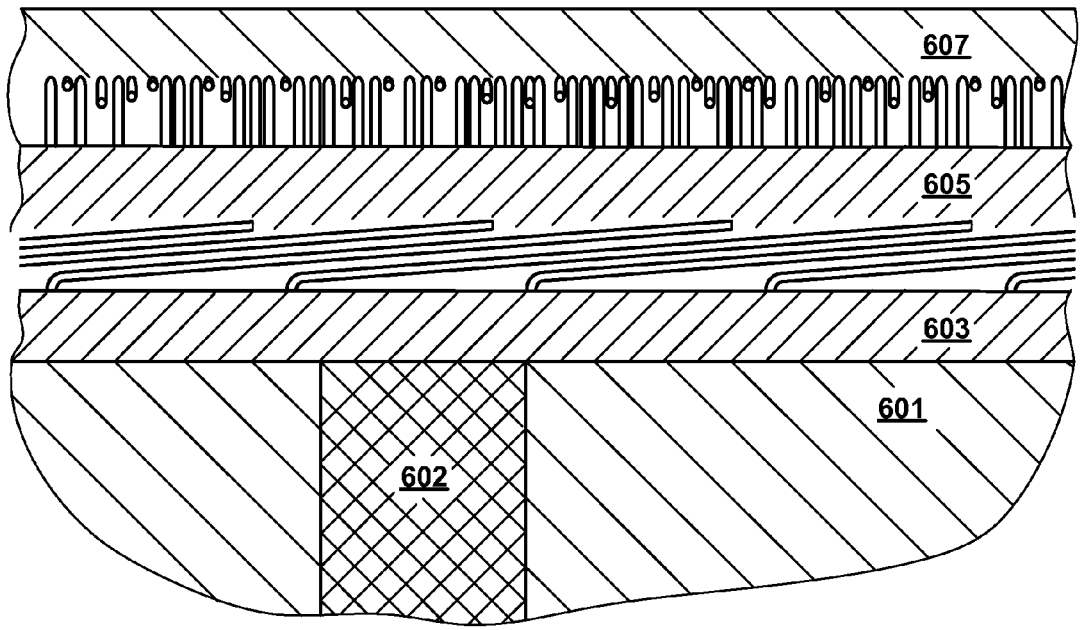
Figure 7:
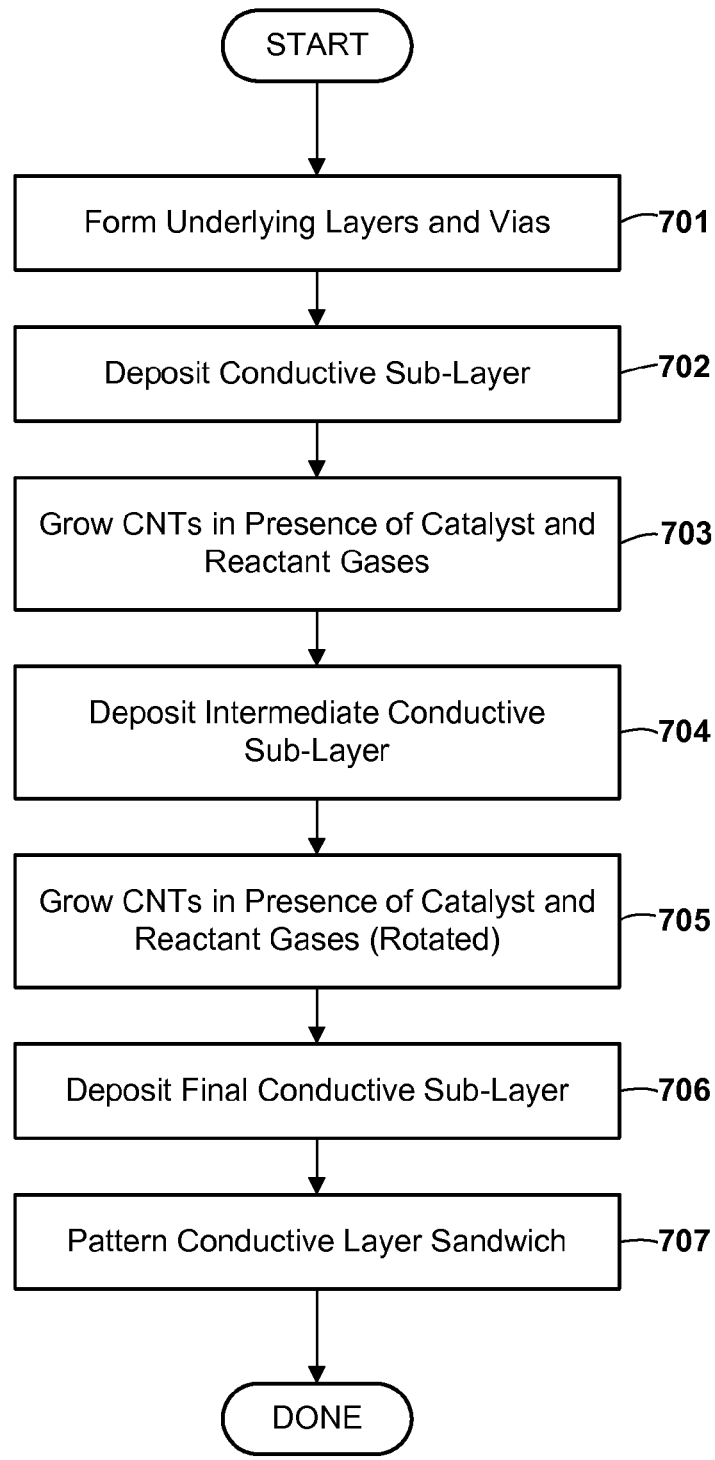
FIG. 7 is a flow diagram showing the overall process steps for forming a carbon nanotube conductive layer sandwich, according to the second preferred embodiment.

A process of creating an oriented carbon nanotube conductive layer according to an alternative or second preferred embodiment is illustrated in the flow diagram of FIG. 7, and the cross-sectional illustrations of FIGS. 6A-6E. As in the case of the first preferred embodiment described above, this process begins from a dielectric layer 601 having one or more conductive vias 602 (of which one is shown), as illustrated in FIG. 6A. Dielectric layer 601 and vias 602 are fabricated on top of another layer (not shown), and are essentially the same as dielectric layer 401 and vias 402 described previously. Forming of dielectric layer 601 and vias 602 are represented in FIG. 7 as step 701.

With the underlying dielectric layer 601 and vias 602 in place, a thin sublayer of a conductive material 603 is deposited over the dielectric and vias (step 702). Sublayer 603 is preferably doped polysilicon or doped amorphous silicon, which could be either P or N doped, provided there is sufficient doping to impart conductivity to the silicon. Sublayer 603 might alternatively be any of the materials listed as possible materials for sublayer 403, as any of these materials can be readily etched using reactive ion etching, and have suitable conductivity. Copper or gold are possible, but in this instance are not preferred because they would interfere with the iron catalyst and inhibit carbon nanotube growth; if copper or gold is used, a suitable liner, such as TaN or TiN, should be deposited over the copper or gold to avoid degradation of the catalyst. The thickness of conductive layer 603 is preferably 5-20 nm, and more specifically preferred to be 5-10 nm. FIG. 6A shows a resulting portion of a chip surface in cross section, after performing step 702, it being understood that in fact dielectric layer 601 contains multiple vias 602, and that additional layers (not shown) are formed below dielectric layer 601.

Carbon nanotubes 604 are then grown in the presence of a catalyst and reactant gas flow (step 703). The wafer containing the chip is placed in a chemical vapor deposition chamber at 900° C. in the presence of an iron catalyst and reactant gases having a uniform directional flow in the chamber. The reactants are preferably carbon monoxide and hydrogen. The iron catalyst is introduced upstream of the wafer. The iron catalyst reacts with the carbon monoxide/hydrogen reactant gases, and is carried through the vapor and onto the chip surface. The reaction is allowed to proceed for 10-100 minutes, until carbon nanotubes of suitable length, such as 0.5-5 mm, are grown on the substrate. The iron catalyst. is deposited on the surface as particles (not shown), and the carbon nanotubes grow out from the particles in the direction of the gas flow, i.e. the carbon nanotubes are oriented parallel to the direction of flow of the reactant gases. The wafer is oriented relative to this flow in order to grow the carbon nanotubes in the desired orientation on the chip. The carbon nanotubes thus produced are generally single walled, some being conductive and some being semiconductors. FIG. 6B shows a resulting portion of the chip in cross section after performing step 703. In this case, the gas flow is parallel to the plane of the cross section, and the resulting carbon nanotubes 604 are also parallel to the plane of the cross section. The carbon nanotubes 604 are substantially parallel to the surface of sublayer 603, their inclination with respect to the surface being exaggerated for illustrative purposes in FIG. 6B.

An intermediate conductive sublayer 605 is then deposited over the carbon nanotubes (step 704). Sublayer 605 preferably has a thickness of 5-20 nm, and more specifically it is preferred that the thickness be 5-10 nm. Sublayer 605 is preferably doped polysilicon or doped amorphous silicon, as in sublayer 603, but can alternatively be of any material listed above for use in sublayer 403. If copper or gold is used, a liner of TaN or TiN (not shown), having a thickness of 5-10 nm, is applied over the copper or gold, as in step 702. FIG. 6C shows a resulting portion of the chip in cross section after performing step 704.

Carbon nanotubes 606 of a second sublayer are then grown in the presence of a catalyst and reactant gas flow (step 705), using the same process described above with respect to step 703. In this case, the wafer is oriented at an angle, preferably substantially perpendicular, to the wafer's orientation when nanotubes 604 were grown. The resulting nanotubes 606 are thus oriented horizontally and perpendicular to the orientation of nanotubes 604. FIG. 6D shows a resulting portion of the chip in cross section after performing step 705. In this case, the gas flow is perpendicular to the plane of the cross section, resulting carbon nanotubes 606 being also perpendicular to the plane of the cross section.

A final conductive sublayer 607 is then deposited over carbon nanotubes 606 (step 706). Sublayer 607 preferably has a thickness of 5-20 nm, and more specifically it is preferred that the thickness be 5-10 nm. Sublayer 607 is preferably copper, but can alternatively be of any material listed above for use in sublayer 403. Since no further catalyst layer will be deposited, and carbon nanotubes have already been grown from the previous catalysts, catalyst poisoning by the copper is not a concern. However, if copper or gold is used, a liner of TaN or TiN, having a thickness of 5-10 nm, is applied over the copper or gold, as in steps 702 and 704, to prevent copper leaching into the dielectric. FIG. 6E shows a resulting portion of the chip in cross section after performing step 706. The conductive layer sandwich (comprising multiple sublayers 603-606) is then patterned into multiple discrete conductors (step 707), and additional layers are constructed in the integrated circuit as needed.

Figure 8A:
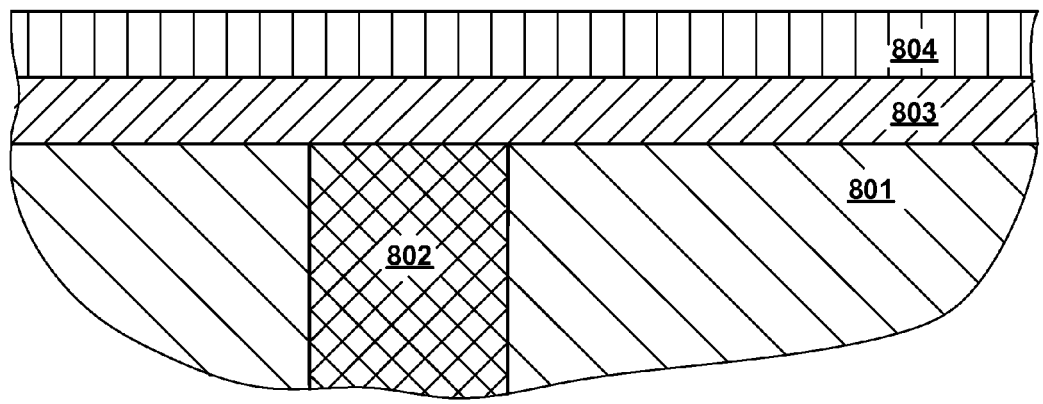
FIGS. 8A-8H are simplified enlarged cross-sectional views of a portion of an integrated circuit chip, showing the construction of a carbon nanotube conductive layer sandwich, in accordance with a third preferred embodiment.
Figure 8B:
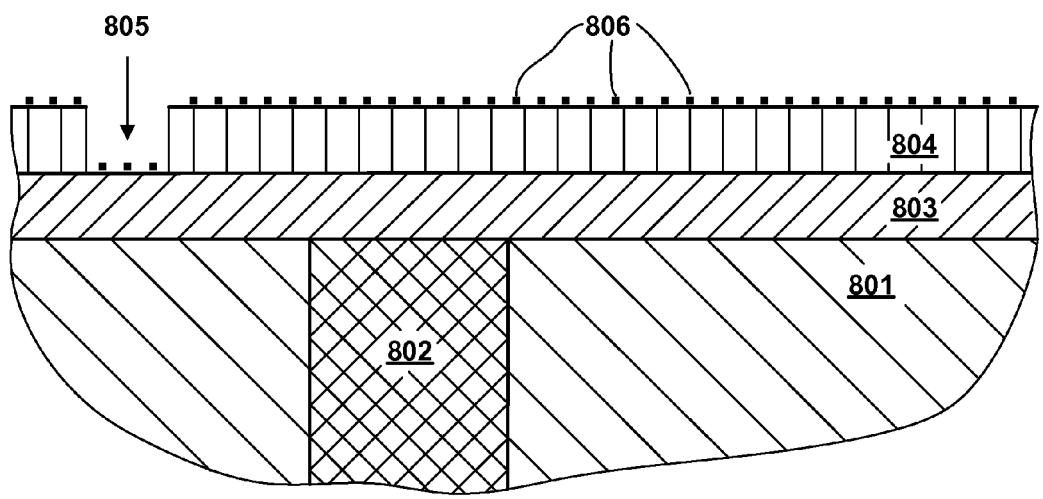
Figure 8C:
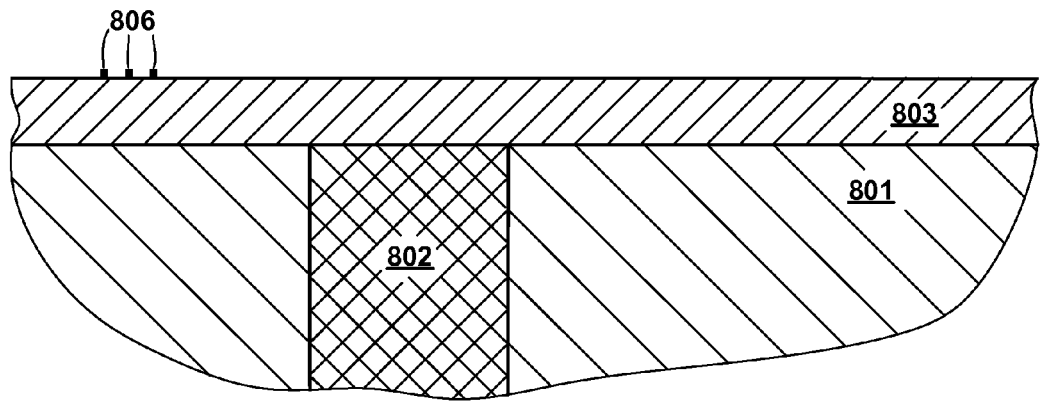
Figure 8D:
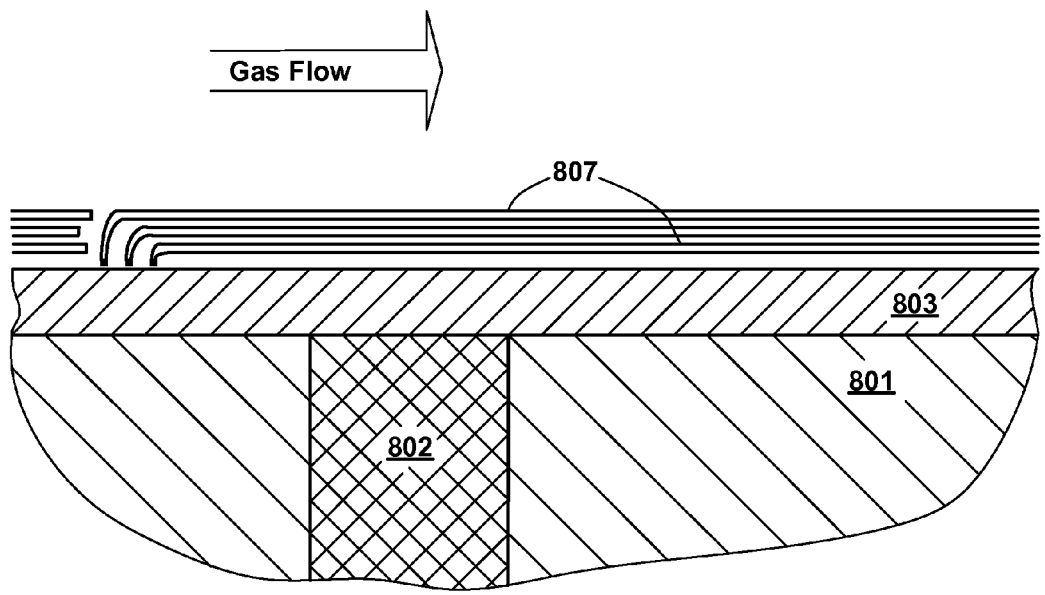
Figure 8E:
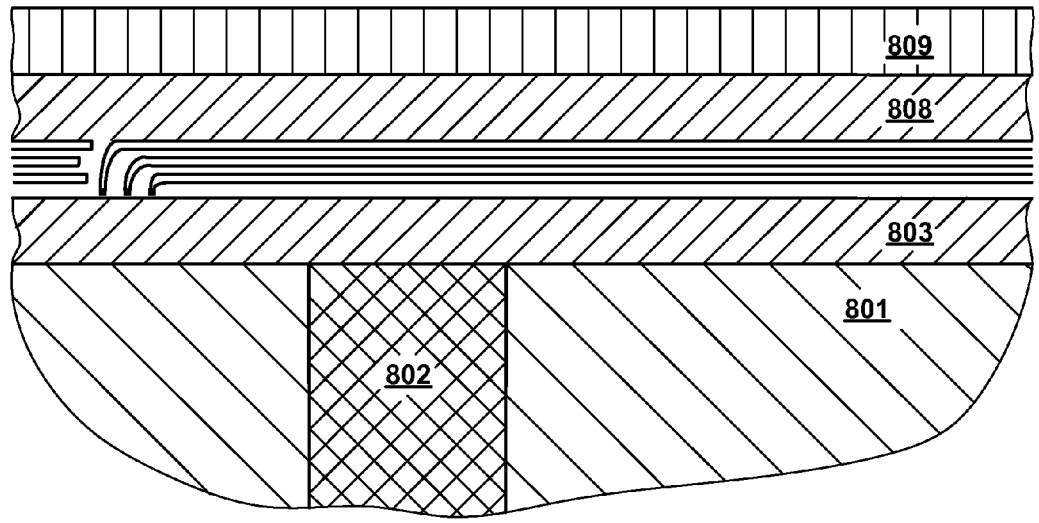
Figure 8F:
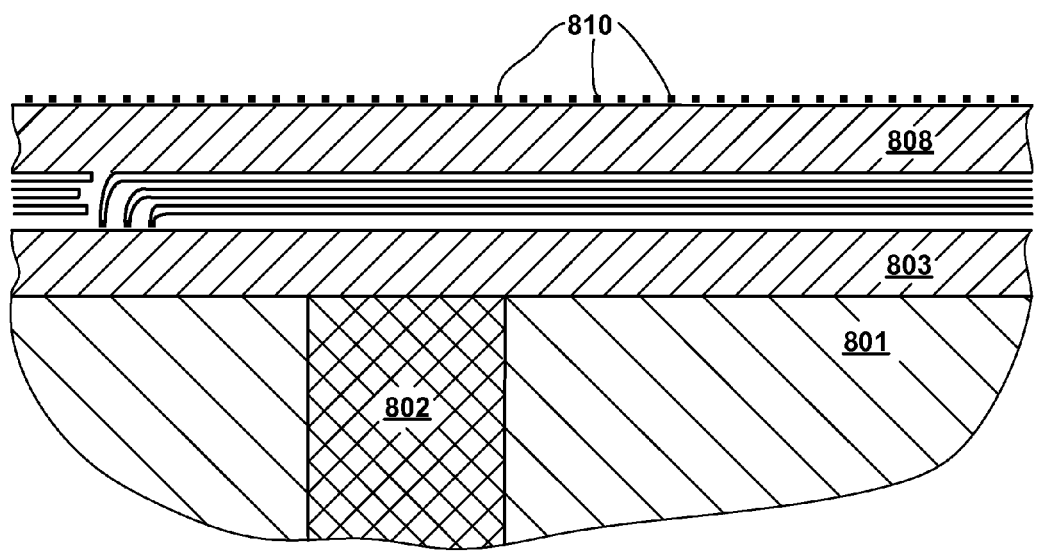
Figure 8G:
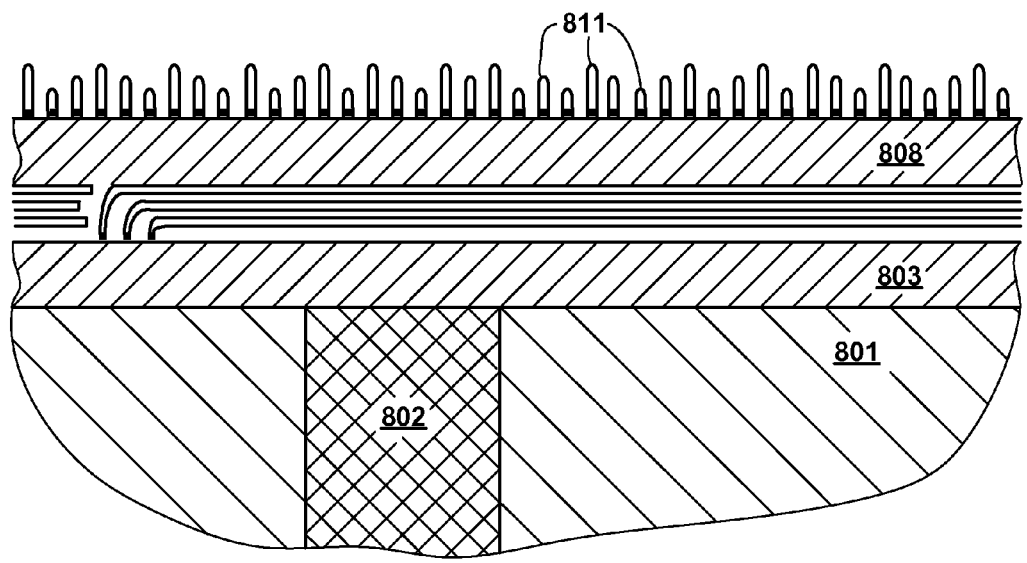
Figure 9:
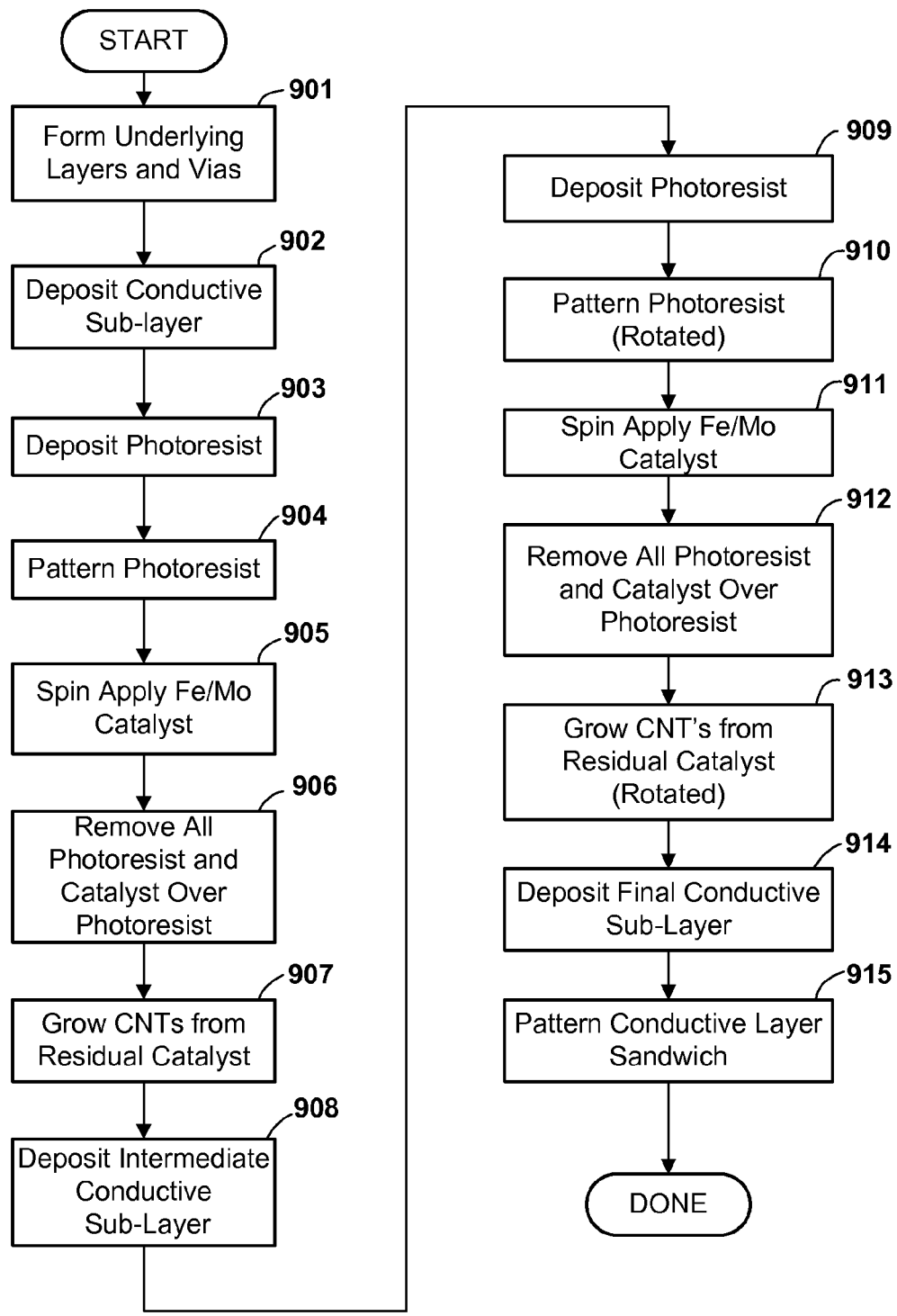
FIG. 9 is a flow diagram showing the overall process steps for forming a carbon nanotube conductive layer sandwich, according to the third preferred embodiment.

A process of creating an oriented carbon nanotube conductive layer according to another alternative or third preferred embodiment is illustrated in the flow diagram of FIG. 9, and the cross-sectional illustrations of FIGS. 8A-8G. The third preferred embodiment is similar to the second, except that catalyst is selectively deposited on the chip surface before carbon nanotubes are grown, rather than be introduced into the vapor. As in the case of the first and second preferred embodiments described above, this process begins from a dielectric layer 801 having one or more conductive vias 802 (of which one is shown), as illustrated in FIG. 8A. Dielectric layer 801 and vias 802 are fabricated on top of another layer (not shown), and are essentially the same as dielectric layer 401 and vias 402 described previously. Forming of dielectric layer 801 and vias 802 are represented in FIG. 9 as step 901.

With the underlying dielectric layer 801 and vias 802 in place, a thin sublayer of a conductive material 803 is deposited over the dielectric and vias (step 902). Sublayer 803 is preferably doped polysilicon or doped amorphous silicon, as in sublayer 603, although it might alternatively be any of the materials listed above for use in sublayer 403, as any of these materials can be readily etched using reactive ion etching, and have suitable conductivity. Copper or gold are possible materials, but are not preferred because they would interfere with the iron catalyst and inhibit carbon nanotube growth; if copper or gold is used, a suitable liner, such as TaN or TiN, should be deposited over the copper or gold to avoid degradation of the catalyst. The thickness of conductive layer 803 is preferably 5-20 nm, and more specifically preferred to be 5-10 nm. A positive photoresist 804, preferably 200-1000 nm thick, is then applied to the exposed chip surface (step 903). FIG. 8A shows a resulting portion of a chip surface in cross section, after performing step 903, it being understood that in fact dielectric layer 801 contains multiple vias 802, and that additional layers (not shown) are formed below dielectric layer 801.

Photoresist 804 is patterned lithographically to create relatively wide parallel ridges of photoresist separated by relatively narrow trenches 805, where photoresist is absent (step 904). Preferably, the ridges are approximately 100-1000 μm wide, and the trenches separating the ridges 50-1000 nm wide. After the resist is developed, an iron/molybdenum catalyst is spin applied from hexane solution to the entire chip surface (step 905). Preferably, the catalyst is a composition having an approximately 5:1 ratio of iron to molybdenum, prepared from the thermal decomposition of iron carbonyl and molybdenum carbonyl under nitrogen atmosphere in an octyl ether solution. The spin application causes catalyst particles 806 to be deposited on the surface, both on the photoresist ridges and in the trenches. FIG. 8B shows a resulting portion of a chip surface in cross section, after performing step 905. In the cross section of FIG. 8B, trenches 805 run perpendicular to the plane of the cross section.

The chip surface is then blanket exposed, and the photoresist 804 developed a second time to remove all the photoresist (step 906). Removal of the photoresist also removes those catalyst particles which were deposited over the photoresist. However, those catalyst particles which were deposited in the trenches remain largely in place after removal of the photoresist. The net effect is to provide narrow parallel strips of catalyst particles on the chip surface, separated by relatively large areas where no catalyst particles remain on the surface, as shown in the resulting cross section of FIG. 8C. These catalyst particles serve as the nucleation points for the growth of carbon nanotubes, performed in the next step.

Carbon nanotubes 807 are then grown from the catalyst particles 806 in the presence of a reactant gas flow (step 907). The wafer containing the chip is placed in a chemical vapor deposition chamber at 900° C. in the presence of reactant gases having a uniform directional flow in the chamber. The reactants are preferably carbon monoxide and hydrogen. The iron/molybdenum catalyst reacts with the carbon monoxide/hydrogen gases to initiate growth of carbon nanotubes from the catalyst particles. The reaction is allowed to proceed for 10-100 minutes, until carbon nanotubes of suitable length, such as 0.5-5 mm, are grown on the substrate. The carbon nanotubes are oriented parallel to the direction of flow of the reactant gases. The wafer is oriented relative to this flow in order to grow the carbon nanotubes in the desired orientation on the chip. The carbon nanotubes thus produced are generally single walled, some being conductive and some being semiconductors. FIG. 8D shows a resulting portion of the chip in cross section after performing step 907. In this case, the gas flow is parallel to the plane of the cross section, and the resulting carbon nanotubes 807 are also parallel to the plane of the cross section.

An intermediate conductive sublayer 808 is then deposited over carbon nanotubes 807 (step 908). Sublayer 808 preferably has a thickness of 5-20 nm, and more specifically it is preferred that the thickness by 5-10 nm. Sublayer 808 is preferably doped polysilicon or doped amorphous silicon, as in sublayer 603, but can alternatively be of any material listed above for use in sublayer 403. If copper or gold is used, a liner of TaN or TiN (not shown), having a thickness of 5-10 nm, is applied over the copper or gold, as in step 902.

A second layer sublayer of carbon nanotubes is then formed by repeating steps 903-907. Specifically, positive photoresist 809 is applied to sublayer 808 (step 909), as described above with respect to step 903. FIG. 8E shows a resulting portion of a chip surface in cross section, after performing step 909. Photoresist 809 is patterned lithographically to create relatively wide parallel ridges separated by relatively narrow trenches (step 910), as described above with respect to step 904. The pattern of ridges and trenches preferably has the same dimensions as those used in step 904, but the orientation of the ridges and trenches is rotated (preferably perpendicular) to the orientation of the earlier formed ridges and trenches. Iron/molybdenum catalyst particles 810 are applied to the entire chip surface (step 911), as described above with respect to step 905. The photoresist 809 is then developed a second time and removed, along with all catalyst particles except those in the trenches (step 912), as described above with respect to step 906. FIG. 8F shows the chip in cross section after step 912. The remaining catalyst particles 810 after step 912 are arranged in narrow parallel strips running parallel to the plane of the cross section.

Carbon nanotubes 811 of a second sublayer are then grown from the catalyst particles 810 in the presence of a reactant gas flow (step 913), using the same process described above with respect to step 907. In this case, the wafer is oriented at an angle, preferably substantially perpendicular, to the wafer's orientation when nanotubes 807 were grown. The resulting nanotubes 811 are thus oriented horizontally and perpendicular to the orientation of nanotubes 807. FIG. 8G shows a resulting portion of the chip in cross section after performing step 913. In this case, the gas flow is perpendicular to the plane of the cross section, resulting carbon nanotubes 811 being also perpendicular to the plane of the cross section.

Figure 8H:
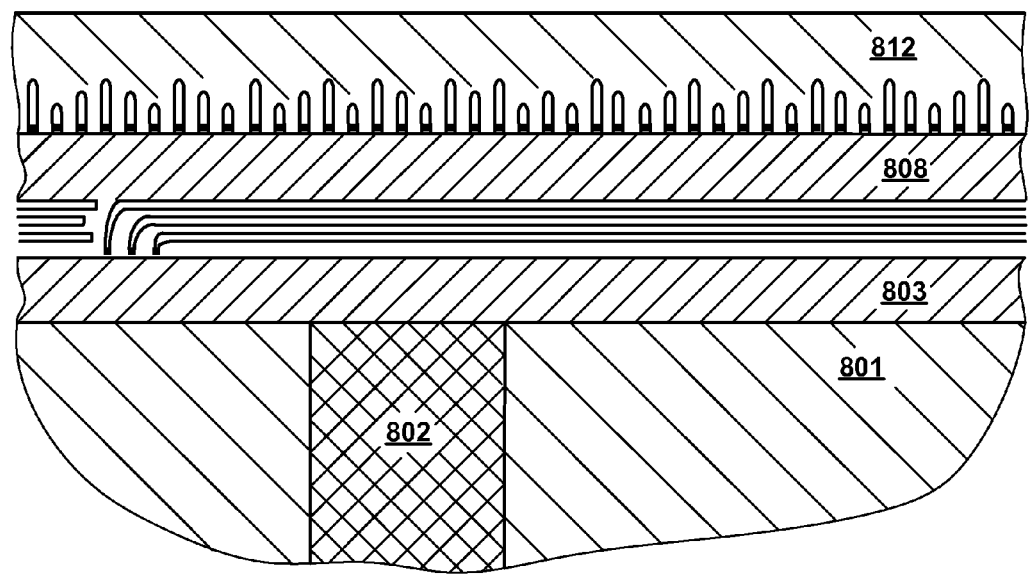

A final conductive sublayer 812 is then deposited over carbon nanotubes 811 (step 914). Sublayer 812 preferably has a thickness of 5-20 nm, and more specifically it is preferred that the thickness by 5-10 nm. Sublayer 812 is preferably copper, but can alternatively be of any material listed above for use in sublayer 403. If copper or gold is used, a liner of TaN or TiN, having a thickness of 5-10 nm, is applied over the copper or gold, as in steps 908 and 902. FIG. 8H shows a resulting portion of the chip in cross section after performing step 914. The conductive layer (comprising multiple sublayers 803, 807, 808, 811 and 812) is then patterned into multiple discrete conductors (step 915), and additional layers are constructed in the integrated circuit as needed.

In steps 517, 707, and 915, the continuous conductive layer sandwich formed according to the various techniques described is patterned into discrete conductors. To the extent that the carbon nanotube sandwich structure enhances the conductivity of the conductive layer vis-a-vis conventional metal materials, it may be possible to reduce wire dimensions, potentially increasing circuit density, reducing line capacitances, and improving device speed. In order to pattern the sandwich, photo-resist is applied to the top surface and exposed with the desired wiring pattern. The resist pattern is transferred into the sandwich with a subtractive etch process, which etches all sublayers down to the underlying dielectric layer (feature 401, 601 or 801). Because it is difficult to etch copper with reactive ion etching processes, where copper layers are used, the thickness of such layers should be limited to 10-20 nm, which can be removed using sputter reactive ion etching processes.

Various dimensions, materials, process parameters and so forth have been given herein as representative or preferred values using available technology. However, it will be appreciated that as technological capabilities advance, new techniques for performing various processes or constructing integrated circuit components may be developed, and specifically new techniques for creating and manipulating carbon nanotubes may be developed. The representative techniques described herein are not intended to limit the present invention to any particular dimension, material, or process parameter.

In the preferred embodiment, the conductive layer sandwich contains two sublayers of carbon nanotubes, the carbon nanotubes within one of the two sublayers being oriented substantially perpendicular to the carbon nanotubes within the other sublayer. Perpendicular orientation of two sub-layers is used to obtain most nearly uniform conductivity in any direction. However, it will be recognized that in some applications, it may be unnecessary or even undesirable to obtain uniform conductivity in any direction. For example, in conventional integrated circuit design, it is common to arrange the conductors within any particular conductive layer in a single direction, and to alternate directions with alternate conductive layers. In such applications, it may be desirable to use an angle of orientation other than 90 degrees, thereby giving the conductive layer greater conductivity in one direction than in the orthogonal direction. Alternatively, it may be desirable to use only a single sub-layer of carbon nanotubes, oriented in the direction of the conductors to provide maximum conductivity, thereby reducing the number of process steps necessary to fabricate the conductive layer.

An integrated circuit module has been shown and described in the preferred embodiment herein as a component of a digital computer system. However, as is well known, integrated circuit modules are used in a variety of digital devices. An integrated circuit chip in accordance with the present invention could be used in any digital device, whether or not such device is called a "computer system". A few examples of such devices include: limited function digital devices such as personal digital assistants, cell phones, digital cameras, controllers for buildings, automobiles and other machinery, robotic systems, and cell phones. However, as is well known, integrated circuit chips are being incorporated into an ever more devices, and the above enumeration should not be considered a complete enumeration or limitation on the types of devices which might use integrated circuit chips.

Although a specific embodiment of the invention has been disclosed along with certain alternatives, it will be recognized by those skilled in the art that additional variations in form and detail may be made within the scope of the following claims:

What is claimed is:

1. A method of making an integrated circuit chip, comprising the steps of:
   providing a relatively broad, flat chip substrate having a planar orientation;
   forming a plurality of active devices on said substrate;
   forming at least one dielectric layer over said substrate and said active devices, said dielectric layer containing a plurality of electrically conductive vias for making electrical connections to said active devices;
   forming a conductive layer over said at least one dielectric layer, said conductive layer being substantially parallel to said planar orientation of said chip substrate, said step of forming a conductive layer comprising:
   (a) forming a first sublayer of carbon nanotubes oriented in a first direction substantially parallel to said planar orientation of said chip substrate by forming a first catalyst on at least a portion of a first surface substantially parallel to said planar orientation of said chip substrate, and growing said carbon nanotubes of said first sublayer from said first catalyst in the presence of a flow of reactant gases in said first direction; and
   (b) forming a second sublayer of carbon nanotubes oriented in a second direction substantially parallel to said planar orientation of said chip substrate by forming a second catalyst on at least a portion of a second surface substantially parallel to said planar orientation of said chip substrate, and growing said carbon nanotubes of said second sublayer in the presence of a flow of reactant gases in said second direction, said second direction lying at said non-zero angle with respect to said first direction.

2. The method of making an integrated circuit chip of claim 1, wherein said first direction is substantially perpendicular to said second direction.

3. The method of making an integrated circuit chip of claim 1, wherein said step of forming a conductive layer over said at least one dielectric layer further comprises the step of:
   (c) forming a first sublayer of a homogeneous conductive material.

4. The method of making an integrated circuit chip of claim 3, wherein said homogenous conductive material is one of the set consisting of: copper, tungsten, molybdenum, titanium, tantalum, titanium nitride, tantalum nitride, tungsten silicide, doped polysilicon and doped amorphous silicon.

5. The method of making an integrated circuit chip of claim 1,
   wherein forming a first catalyst on at least a portion of a first surface substantially parallel to said planar orientation of said chip substrate comprises forming said first catalyst on a first plurality of elongated parallel strips on said first surface; and
   wherein forming a second catalyst on at least a portion of a second surface substantially parallel to said planar orientation of said chip substrate comprises forming said second catalyst on a second plurality of elongated parallel strips on said second surface.

6. The method of making an integrated circuit chip of claim 1, wherein said reactant gases comprise carbon monoxide and hydrogen.

7. The method of making an integrated circuit chip of claim 1, wherein said first catalyst and said second catalyst comprise iron and molybdenum.

8. The method of making an integrated circuit chip of claim 7, wherein said first catalyst and said second catalyst are spin applied to produce catalyst particles.

9. The method of making an integrated circuit chip of claim 1, wherein said step of forming a conductive layer further comprises the step of:
  (c) patterning said conductive layer to form a plurality of discrete electrical conductors therein, each said electrical conductor forming a portion of a respective electrical logic circuit path to one or more said plurality of active devices.

10. The method of making an integrated circuit chip of claim 1, wherein said integrated circuit chip is a processor chip containing at least one central processing unit for a digital computing device.

* * * * *